United States Patent
Choi et al.

(10) Patent No.: US 12,062,404 B2
(45) Date of Patent: Aug. 13, 2024

(54) VOLTAGE TRIMMING CIRCUIT

(71) Applicant: SAMSUNG ELECTRONICS CO., LTD., Suwon-si (KR)

(72) Inventors: Minho Choi, Seoul (KR); Jaeseong Lim, Cheongju-si (KR); Kyungryun Kim, Seoul (KR); Daehyun Kim, Suwon-si (KR); Wonil Bae, Seongnam-si (KR); Hohyun Shin, Suwon-si (KR); Sanghoon Jung, Hwaseong-si (KR); Hyongryol Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/239,548

(22) Filed: Aug. 29, 2023

(65) Prior Publication Data
US 2023/0410925 A1    Dec. 21, 2023

Related U.S. Application Data

(63) Continuation of application No. 17/591,987, filed on Feb. 3, 2022, now Pat. No. 11,776,644.

(30) Foreign Application Priority Data

Mar. 5, 2021 (KR) .................. 10-2021-0029641

(51) Int. Cl.
*G11C 17/18* (2006.01)
*G11C 17/16* (2006.01)
*G11C 29/08* (2006.01)

(52) U.S. Cl.
CPC .............. *G11C 17/18* (2013.01); *G11C 17/16* (2013.01); *G11C 29/08* (2013.01)

(58) Field of Classification Search
CPC .................. G11C 17/18; G11C 17/16
(Continued)

(56) References Cited

U.S. PATENT DOCUMENTS 5,991,221 A * 11/1999 Ishikawa ............... G11C 5/145
                                                        365/189.09
6,949,971 B2    9/2005 Jang
(Continued)

FOREIGN PATENT DOCUMENTS

CN        102157193        8/2011
CN        102480220        5/2012
(Continued)

OTHER PUBLICATIONS

Notice of Allowance issued in corresponding TW Patent Application No. 111107797 on Jan. 10, 2023.

*Primary Examiner* — Muna A Techane
(74) *Attorney, Agent, or Firm* — F. CHAU & ASSOCIATES, LLC

(57) ABSTRACT

A voltage trimming circuit including: a first resistance circuit having a first resistance value determined by up codes and down codes; a second resistance circuit having a second resistance value determined by the up codes and the down codes; and a comparator to output a voltage detection signal by comparing a voltage level of a reference voltage trimming node to that of a feedback node, wherein the voltage detection signal adjusts the up and down codes, which increase the first resistance value and decrease the second resistance value when the voltage level of the reference voltage trimming node is higher than that of the feedback node, and adjusts the up and down codes, which decrease the first resistance value and increase the second resistance value when the voltage level of the reference voltage trimming node is lower than that of the feedback node.

20 Claims, 12 Drawing Sheets

(58) Field of Classification Search
USPC .......................................................... 365/96
See application file for complete search history.

(56) References Cited

U.S. PATENT DOCUMENTS

| | | | |
|---|---|---|---|
| 7,920,011 | B1 | 4/2011 | Tseng |
| 10,236,767 | B2 | 3/2019 | Park et al. |
| 2006/0132114 | A1* | 6/2006 | Giduturi ................ G11C 16/30 |
| | | | 257/E27.103 |
| 2009/0033373 | A1 | 2/2009 | Shyr et al. |
| 2018/0323703 | A1* | 11/2018 | Park .......................... G05F 1/56 |
| 2020/0366194 | A1 | 11/2020 | Tsai |
| 2022/0284975 | A1 | 9/2022 | Choi et al. |

FOREIGN PATENT DOCUMENTS

| | | |
|---|---|---|
| KR | 10-2003-0008412 | 1/2003 |
| KR | 10-0545711 | 1/2006 |
| KR | 10-2012-0122583 | 11/2012 |
| KR | 10-1965360 | 3/2019 |
| TW | 201843555 | 12/2018 |

* cited by examiner

VOLTAGE TRIMMING CIRCUIT

CROSS-REFERENCE TO RELATED APPLICATIONS

This application is a continuation of U.S. patent application Ser. No. 17/591,987 filed on Feb. 3, 2022, which claims priority under 35 U.S.C. § 119 to Korean Patent Application No. 10-2021-0029641, filed on Mar. 5, 2021 in the Korean Intellectual Property Office, the disclosures of which are incorporated by reference herein in their entireties.

TECHNICAL FIELD

The inventive concept relates to a semiconductor device, and more particularly, to a voltage trimming circuit capable of increasing the reliability of a test, a memory device including the voltage trimming circuit, and a test method of the memory device.

DISCUSSION OF RELATED ART

A semiconductor device including a memory may include a plurality of circuits that are driven by various internal voltages. The semiconductor device may include voltage generation circuitry for generating the various internal voltages. The internal voltages generated by the voltage generation circuitry may not be precisely set to target voltage levels. In other words, deviations may exist between the target voltage levels and the actual internal voltages generated by the voltage generation circuitry. Accordingly, an operation of adjusting the internal voltages, in other words, a trimming, may be employed. When trimming the internal voltages, a test device may provide a trimming code to read the internal voltages via pads or pins of a semiconductor device and adjust the internal voltage levels.

When semiconductor devices are in a wafer state, the test device may perform the trimming on each of the internal voltages so that the internal voltage is set to the target voltage level according to a process change in each of the semiconductor devices. When the semiconductor devices are in a wafer state, different trimming codes may be provided and anti-fuses corresponding to the different trimming codes may be ruptured. Thereafter, the test device may perform the trimming on the internal voltage for evaluating and accelerating a range of the target voltage level for the semiconductor device in a package state. In the alternative, an identical trimming code may be provided to each of the semiconductor devices in the package state to increase test productivity. However, this may cause the distribution of the internal voltages of the semiconductor device to be widely spread, thereby decreasing the reliability of the test.

SUMMARY

The inventive concept provides a voltage trimming circuit configured to generate a narrow internal voltage distribution during a test, a memory device including the voltage trimming circuit, and a test method of the memory device.

According to an embodiment of the inventive concept, there is provided a voltage trimming circuit configured to trim a reference voltage to a first voltage, the voltage trimming circuit including: a first resistance circuit connected between a reference voltage line and a reference voltage trimming node, the first resistance circuit having a first resistance value determined by up codes and down codes; a second resistance circuit connected between the reference voltage trimming node and a ground voltage line, the second resistance circuit having a second resistance value determined by the up codes and the down codes; and a comparator configured to output a voltage detection signal by comparing a voltage level of the reference voltage trimming node to a voltage level of a feedback node connected to the first voltage, wherein the voltage detection signal adjusts the up codes and the down codes, which increase the first resistance value and decrease the second resistance value when the voltage level of the reference voltage trimming node is higher than the voltage level of the feedback node, and adjusts the up codes and the down codes, which decrease the first resistance value and increase the second resistance value when the voltage level of the reference voltage trimming node is lower than the voltage level of the feedback node.

According to an embodiment of the inventive concept, there is provided a memory device configured to perform a voltage trimming operation, the memory device including: a voltage generation circuit configured to generate a reference voltage and a first voltage; a voltage trimming circuit configured to trim the reference voltage to the first voltage and to output a voltage detection signal by comparing a voltage level of a reference voltage trimming node determined by a first resistance value of a first resistance circuit and a second resistance value of a second resistance circuit to a voltage level of a feedback node connected to the first voltage; and a non-volatile storage storing up codes and down codes, wherein the voltage trimming circuit performs a first voltage trimming during a wafer test of the memory device, and a second voltage trimming during a package test of the memory device, wherein the first voltage trimming adjusts the up codes and the down codes with respect to the first voltage provided at a target voltage level in response to the voltage detection signal, and the second voltage trimming adjusts the up codes and the down codes with respect to the first voltage provided with a target voltage level range having a positive or negative range with respect to the target voltage level in response to the voltage detection signal.

According to an embodiment of the inventive concept, there is provided a test method of a memory device configured to perform a voltage trimming operation, the test method including: testing a wafer level performance of the memory device by using a test device, performing a first voltage trimming by using a voltage trimming circuit of the memory device, wherein the voltage trimming circuit outputs a voltage detection signal by comparing a voltage level of a reference voltage trimming node determined by a first resistance value of a first resistance circuit and a second resistance value of a second resistance circuit to a voltage level of a feedback node, and adjusts up codes and down codes with respect to the first voltage provided at a target voltage level in response to the voltage detection signal; and testing a package level performance of the memory device by using the test device, wherein a second voltage trimming is performed by using the voltage trimming circuit during the package level performance test, and adjusts the up codes and the down codes with respect to the first voltage provided with a target voltage level range comprising a positive or negative range with respect to the target voltage level in response to the voltage detection signal.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
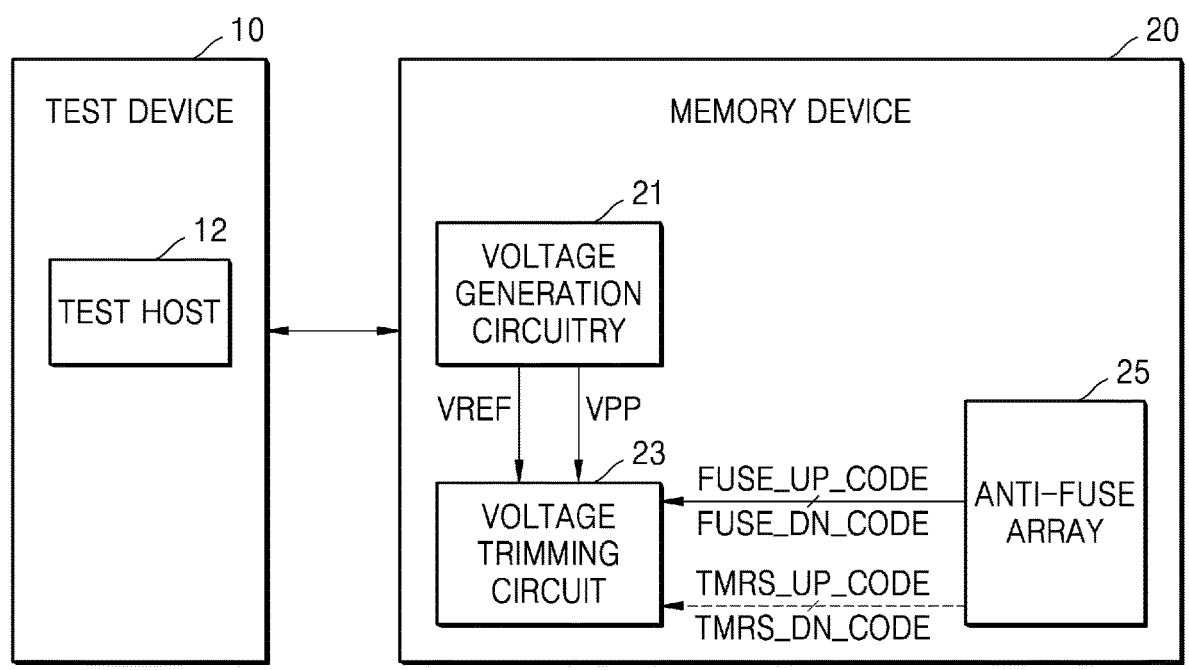
FIG. 1 is a diagram of a memory device including a voltage trimming circuit, according to an embodiment of the inventive concept.

FIG. 1 is a diagram of a memory device 20 including a voltage trimming circuit 23, according to an embodiment of the inventive concept.

Referring to FIG. 1, the memory device 20 may be tested by a test device 10. The test device 10 may include a test host 12 for testing the memory device 20 or a device under test (DUT). The test host 12 may control hardware, software, and firmware to perform a test operation on the memory device 20. The test host 12 may transmit a test signal to the memory device 20, or receive a performance result value in response to the test signal from the memory device 20.

The test host 12 may be implemented by a test program. The test program may include a test algorithm or pattern for performing a test operation. For example, the test host 12 may store particular data in a memory area of the memory device 20, and then, may read the stored particular data to determine a pass/fail of the test operation depending on whether the read data is the same as the particular data provided to the memory area. The test host 12 may measure a change in voltage/current/frequency under various driving conditions, and test whether a range of the change is within an allowable range. The test host 12 may perform the trimming operation on the voltage trimming circuit 23 of the memory device 20. The test host 12 may provide, to the memory device 20, up codes FUSE_UP_CODE and TMRS_UP_CODE and/or down codes FUSE_DN_CODE and TMRS_DN_CODE.

The memory device 20 may include a voltage generation circuitry 21, the voltage trimming circuit 23, and an anti-fuse array 25.

The voltage generation circuitry 21 may generate various internal voltages for driving circuits of the memory device 20. As an example, the voltage generation circuitry 21 may generate a reference voltage VREF used by circuits of the memory device 20, and a high voltage VPP having a higher voltage level than a power supply voltage. When the memory device 20 includes dynamic random access memory (RAM) (DRAM), the high voltage VPP may be used by a word line driver circuit which drives a word line for turning on n-channel (N) metal-oxide-semiconductor (MOS) (NMOS) cell transistors connected to the word lines.

The voltage trimming circuit 23 may receive the reference voltage VREF and the high voltage VPP, and perform a reference voltage VREF trimming operation on the test host 12. The voltage trimming circuit 23 may be adjusted by the test host 12 so that a level of the reference voltage VREF is trimmed to meet characteristics of a level of the high voltage VPP.

The anti-fuse array 25 may store the up codes FUSE_UP_CODE and TMRS_UP_CODE and/or the down codes FUSE_DN_CODE and TMRS_DN_CODE, which are adjusted by the test host 12 in the reference voltage VREF trimming operation of the voltage trimming circuit 23. An anti-fuse may be changed from a high resistance state to a low resistance state by an electrical signal.

In another embodiment of the inventive concept, a non-volatile storage may be used instead of the anti-fuse array 25. The non-volatile storage may include any one of a NAND flash memory, a NOR flash memory, magnetic RAM (MRAM), phase-change RAM (PRAM), resistive RAM (RRAM), ferroelectric RAM (FRAM), and thyristor RAM (TRAM). The terms anti-fuse array 25 and non-volatile storage may be used interchangeably.

According to an embodiment of the inventive concept, the test host 12 may not provide, to the memory device 20, a command up code TMRS_UP_CODE and a command down code TMRS_DN_CODE, which have been adjusted during a package test of the memory device 20, of the up codes FUSE_UP_CODE and TMRS_UP_CODE and the down codes FUSE_DN_CODE and TMRS_DN_CODE. In this case, the anti-fuse array 25 may store a fuse up code FUSE_UP_CODE and a fuse down code FUSE_DN_CODE, which have been adjusted during a wafer test of the memory device 20.

Figure 2:
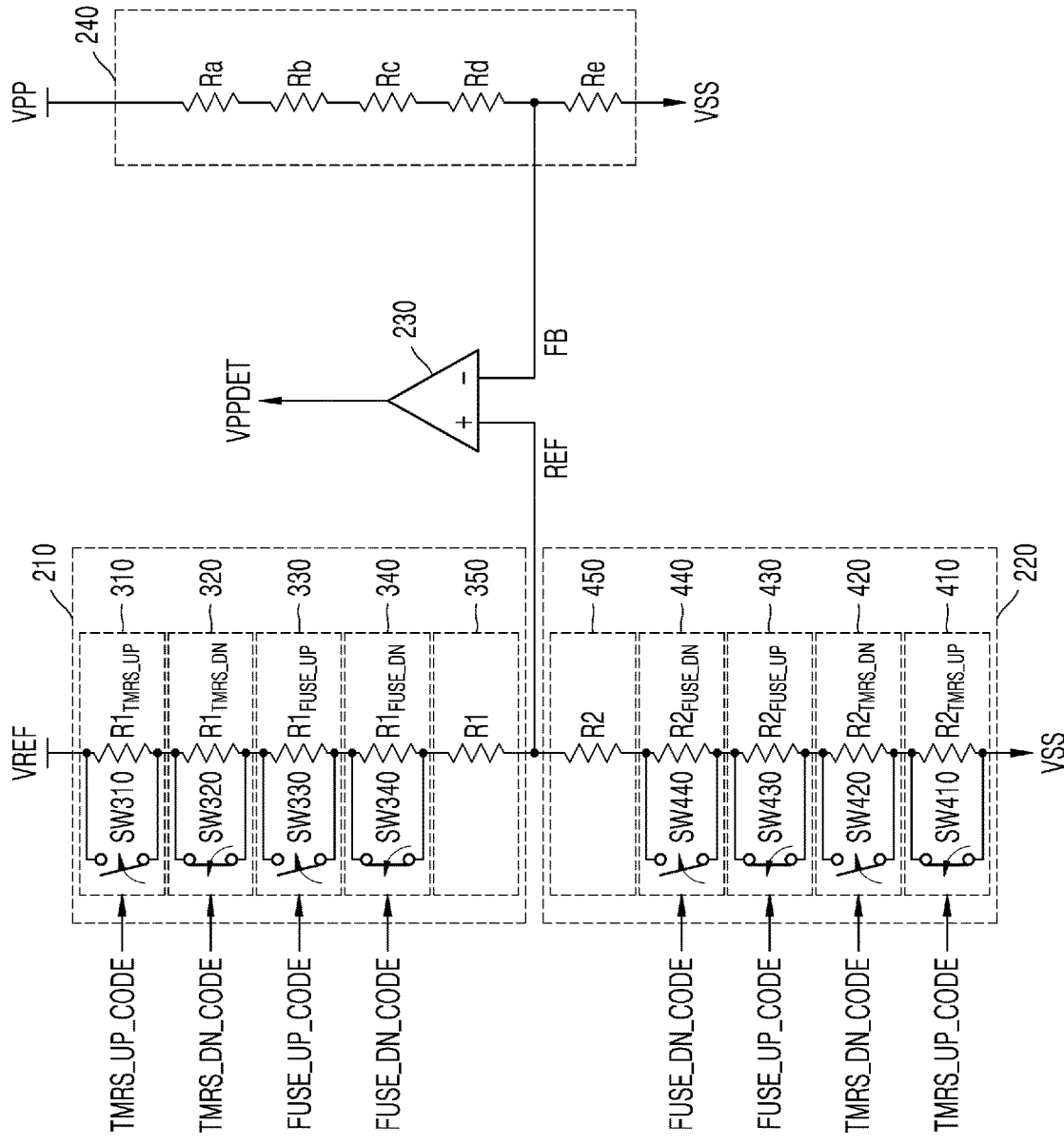
FIG. 2 is a schematic circuit diagram of the voltage trimming circuit in FIG. 1.

FIG. 2 is a schematic circuit diagram of the voltage trimming circuit 23 in FIG. 1.

Referring to FIG. 2, the voltage trimming circuit 23 may include a first resistance circuit unit 210, a second resistance circuit unit 220, a comparator 230, and a voltage generator 240. The first resistance circuit unit 210 and the second resistance circuit unit 220 may be connected in series between a reference voltage VREF line and a ground voltage VSS line, and a connection node between the first resistance circuit unit 210 and the second resistance circuit unit 220 may be set as a reference voltage trimming node REF.

The first resistance circuit unit 210 may be connected between the reference voltage VREF line and the reference voltage trimming node REF. The first resistance circuit unit 210 may include a first command up resistance circuit 310, a first command down resistance circuit 320, a first fuse up resistance circuit 330, a first fuse down resistance circuit 340, and a first resistor 350.

The first command up resistance circuit 310 may have a first command up resistance value $R1_{TMRS\_UP}$, the first command down resistance circuit 320 may have a first command down resistance value $R1_{TMRS\_UP}$, the first fuse up resistance circuit 330 may have a first fuse up resistance value $R1_{FUSE\_UP}$, the first fuse down resistance circuit 340 may have a first fuse down resistance value $R1_{FUSE\_DN}$, and the first resistor 350 may have a first resistance value R1. The first resistance value R1 may be constant, but the first command up resistance value $R1_{TMRS\_UP}$, the first command down resistance value $R1_{TMRS\_DN}$, the first fuse up resistance value $R1_{FUSE\_UP}$ and/or the first fuse down resistance value $R1_{FUSE\_DN}$ may vary.

The first command up resistance circuit 310 may trim the voltage level of the reference voltage trimming node REF by using the command up code TMRS_UP_CODE. The command up code TMRS_UP_CODE may be a trimming code provided to trim the voltage level of the reference voltage trimming node REF during the package test of the memory device 20. The first command up resistance circuit 310 may trim the first command up resistance value $R1_{TMRS\_UP}$ determined by the command up code TMRS_UP_CODE. The command up code TMRS_UP_CODE may be provided to decrease the first command up resistance value $R1_{TMRS\_UP}$ by turning on an internal switch SW310 of the first command up resistance circuit 310, and may increase the voltage level of the reference voltage trimming node REF.

The first command down resistance circuit 320 may trim the voltage level of the reference voltage trimming node REF by using the command down code TMRS_DN_CODE. The command down code TMRS_DN_CODE may be a trimming code provided to trim the voltage level of the reference voltage trimming node REF during the package test of the memory device 120. The first command down resistance circuit 320 may trim the first command down resistance value $R1_{TMRS\_DN}$ determined by the command down code TMRS_DN_CODE. The command down code TMRS_DN_CODE may be provided to increase the first command down resistance value $R1_{TMRS\_DN}$ by turning off an internal switch SW320 of the first command down resistance circuit 320, and may decrease the voltage level of the reference voltage trimming node REF.

The first fuse up resistance circuit 330 may trim the voltage level of the reference voltage trimming node REF by using the fuse up code FUSE_UP_CODE. The fuse up code FUSE_UP_CODE may be a trimming code provided to trim the voltage level of the reference voltage trimming node REF during the wafer test of the memory device 120. The first fuse up resistance circuit 330 may trim the first fuse up resistance value $R1_{FUSE\_UP}$ determined by the fuse up code FUSE_UP_CODE. The fuse up code FUSE_UP_CODE may be provided to decrease the first fuse up resistance value $R1_{FUSE\_UP}$ by turning on an internal switch SW330 of the first fuse up resistance circuit 330, and may increase the voltage level of the reference voltage trimming node REF.

The first fuse down resistance circuit 340 may trim the voltage level of the reference voltage trimming node REF by using the fuse down code FUSE_DN_CODE. The fuse down code FUSE_DN_CODE may be a trimming code provided to trim the voltage level of the reference voltage trimming node REF during the wafer test of the memory device 120. The first fuse down resistance circuit 340 may trim the first fuse down resistance value $R1_{FUSE\_DN}$ determined by the fuse down code FUSE_DN_CODE. The fuse down code FUSE_DN_CODE may be provided to increase the first fuse down resistance value $R1_{FUSE\_DN}$ by turning off an internal switch SW340 of the first fuse down resistance circuit 340, and may decrease the voltage level of the reference voltage trimming node REF.

The second resistance circuit unit 220 may be connected between the reference voltage trimming node REF and the ground voltage VSS line. The second resistance circuit unit 220 may include a second resistor 450, a second fuse down resistance circuit 440, a second fuse up resistance circuit 430, a second command down resistance circuit 420, and a second command up resistance circuit 410. In the present embodiment, the second resistance circuit unit 220 may have a symmetrical structure with respect to the first resistance circuit unit 210.

The second command up resistance circuit 410 may have a second command up resistance value $R2_{TMRS\_UP}$, the second command down resistance circuit 420 may have a second command down resistance value $R2_{TMRS\_UP}$, the second fuse up resistance circuit 430 may have a second fuse up resistance value $R2_{FUSE\_UP}$, the second fuse down resistance circuit 440 may have a second fuse down resistance value $R2_{FUSE\_DN}$, and the second resistor 450 may have a second resistance value R2. The second resistance value R2 may be constant, but the second command up resistance value $R2_{TMRS\_UP}$, the second command down resistance value $R2_{TMRS\_DN}$, the second fuse up resistance value $R2_{FUSE\_UP}$ and/or the second fuse down resistance value $R2_{FUSE\_DN}$ may vary.

The second fuse down resistance circuit 440 may trim the voltage level of the reference voltage trimming node REF by using the fuse down code FUSE_DN_CODE. The second fuse down resistance circuit 440 may trim the second fuse down resistance value $R2_{FUSE\_DN}$ determined by the fuse down code FUSE_DN_CODE. The fuse down code FUSE_DN_CODE may be provided to decrease the second fuse down resistance value $R2_{FUSE\_DN}$ by turning on an internal switch SW440 of the second fuse down resistance circuit 440, and may decrease the voltage level of the reference voltage trimming node REF.

The second fuse up resistance circuit 430 may trim the voltage level of the reference voltage trimming node REF by using the fuse up code FUSE_UP_CODE. The second fuse up resistance circuit 430 may trim the second fuse up resistance value $R2_{TMRS\_UP}$ determined by the fuse up code FUSE_UP_CODE. The fuse up code FUSE_UP_CODE may be provided to increase the second fuse up resistance value $R2_{FUSE\_UP}$ by turning off an internal switch SW430 of the second fuse up resistance circuit 430, and may increase the voltage level of the reference voltage trimming node REF.

The second command down resistance circuit 420 may trim the voltage level of the reference voltage trimming node REF by using the command down code TMRS_DN_CODE. The second command down resistance circuit 420 may trim the second command down resistance value $R2_{TMRS\_DN}$ determined by the command down code TMRS_DN_CODE. The command down code TMRS_DN_CODE may be provided to decrease the second command down resistance value $R_{2TMRS\_DN}$ by turning on an internal switch SW420 of the second command down resistance circuit 420, and may decrease the voltage level of the reference voltage trimming node REF.

The second command up resistance circuit 410 may trim the voltage level of the reference voltage trimming node REF by using the command up code TMRS_UP_CODE. The second command up resistance circuit 410 may trim the second command up resistance value $R2_{TMRS\_UP}$ determined by the command up code TMRS_UP_CODE. The command up code TMRS_UP_CODE may be provided to increase the second command up resistance value $R2_{TMRS\_UP}$ by turning off an internal switch SW410 of the second command up resistance circuit 410, and may increase the voltage level of the reference voltage trimming node REF.

As described above, the second fuse down resistance circuit 440, the second fuse up resistance circuit 430, the second command down resistance circuit 420, and the second command up resistance circuit 410 may, when being trimmed by the fuse down code FUSE_DN_CODE, the fuse up code FUSE_UP_CODE, the command down code TMRS_DN_CODE, and the command up code TMRS_UP- _CODE, operate in an opposite fashion to the first fuse down resistance circuit 340, the first fuse up resistance circuit 330, the first command down resistance circuit 320, and the first command up resistance circuit 310, respectively. As an example, when the second command up resistance value $R2_{TMRS\_UP}$ of the second command up resistance circuit 410 is provided by the command up code TMRS_UP_CODE, the first command up resistance value $R1_{TMRS\_UP}$ may be shorted. When the second fuse up resistance value $R2_{FUSE\_UP}$ of the second fuse up resistance circuit 430 is provided by the fuse up code FUSE_UP_CODE, the first fuse up resistance value $R1_{FUSE\_UP}$ of the first fuse up resistance circuit 330 may be shorted.

The voltage level of the reference voltage trimming node REF determined by the first resistance circuit unit 210 and the second resistance circuit unit 220 may be provided to the comparator 230. The voltage generator 240 may receive and distribute the high voltage VPP, and generate a voltage of a feedback node FB. As an example, the voltage generator 240 may include a plurality of resistors Ra, Rb, Rc, Rd and Re connected between a high voltage VPP line and the ground voltage VSS line, and a connection node between the resistor Rd and the resistor Re may be the feedback node FB. The voltage generator 240 may generate a voltage level of the feedback node FB as VPP×(Re/(Ra+Rb+Rc+Rd+Re)). The high voltage VPP may be received as the target voltage level during the wafer test of the memory device 20, and may be received with a range of the target voltage level having certain positive (+) and/or negative (−) ranges with the target voltage level as a reference during the package test. The voltage level of the feedback node FB generated from the high voltage VPP level may be different in the wafer test and package test.

The comparator 230 may compare the voltage level of the reference voltage trimming node REF to the voltage level of the feedback node FB, and output a voltage detection signal VPPDET. In the comparator 230, the reference voltage trimming node REF may be connected to a non-inverting terminal, and the feedback node FB may be connected to an inverting terminal. In other words, the reference voltage trimming node REF may be connected to a first terminal of the comparator 230, and the feedback node FB may be connected to a second terminal of the comparator 230. When the voltage level of the reference voltage trimming node REF is greater than the voltage level of the feedback node FB, the voltage detection signal VPPDET may be output at a logic high level, and when the voltage level of the reference voltage trimming node REF is less than the voltage level of the feedback node FB, the voltage detection signal VPPDET may be output at a logic low level.

The voltage detection signal VPPDET of the comparator 230 may be provided to the test device 10. The test host 12 may adjust the fuse and command-up codes FUSE_UP_CODE and TMRS_UP_CODE and the fuse and command-down codes FUSE_DN_CODE and TMRS_DN_CODE so that the voltage level of the reference voltage trimming node REF is set to the voltage level of the feedback node FB based on the voltage detection signal VPPDET.

The fuse and command-up codes FUSE_UP_CODE and TMRS_UP_CODE and fuse and command-down codes FUSE_DN_CODE and TMRS_DN_CODE may be constituted by N bits. In this case, N may be a natural number equal to or greater than one. Below, in FIG. 3, an example is described in which each of the fuse up code FUSE_UP_CODE and the fuse down code FUSE_DN_CODE is constituted by 4 bits, and each of the command up code TMRS_UP_CODE and the command down code TMRS_DN_CODE is constituted by 3 bits.

Figure 3:
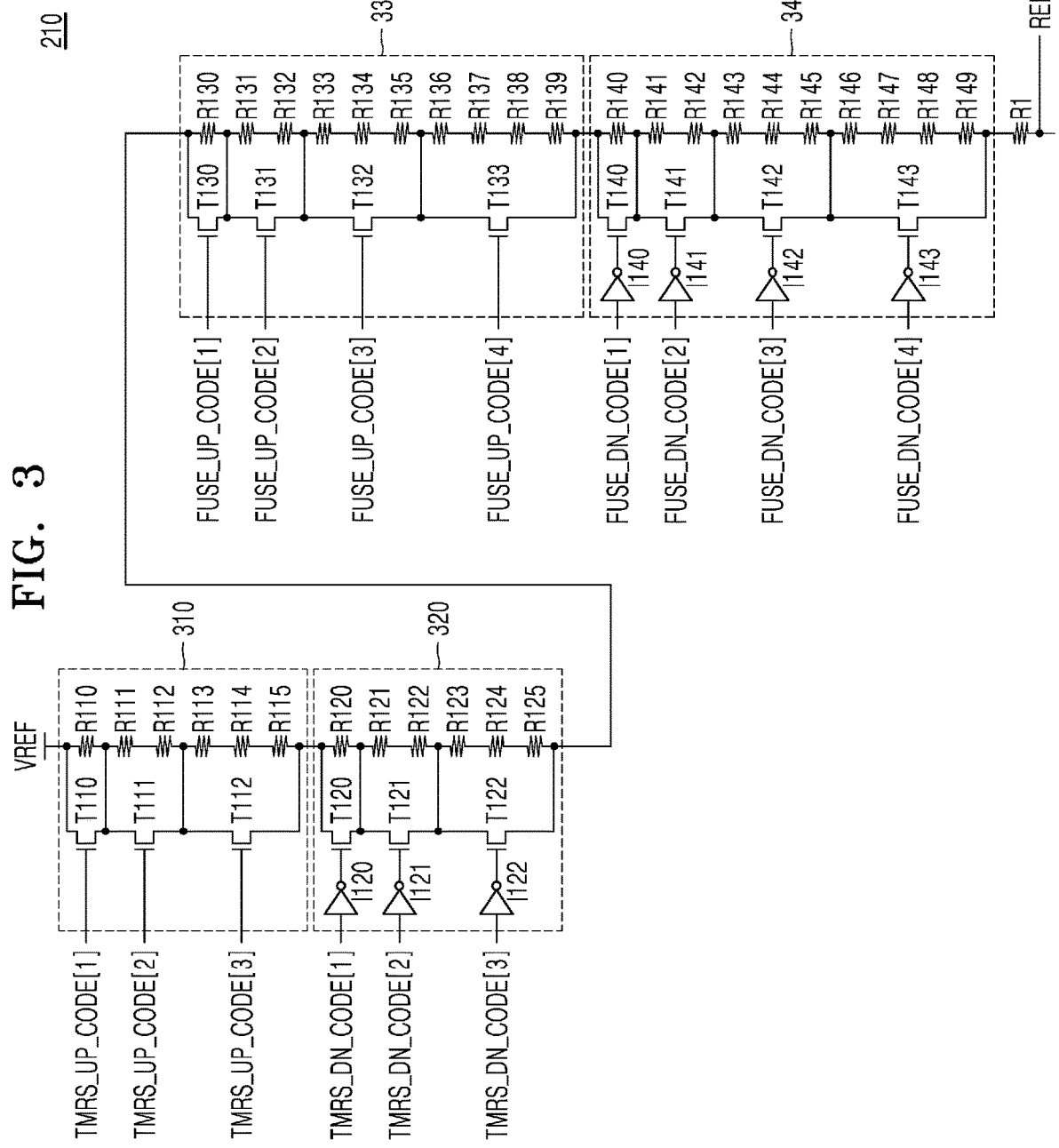
FIG. 3 is a circuit diagram describing in detail a first resistance circuit unit in FIG. 2.
Figure 4:
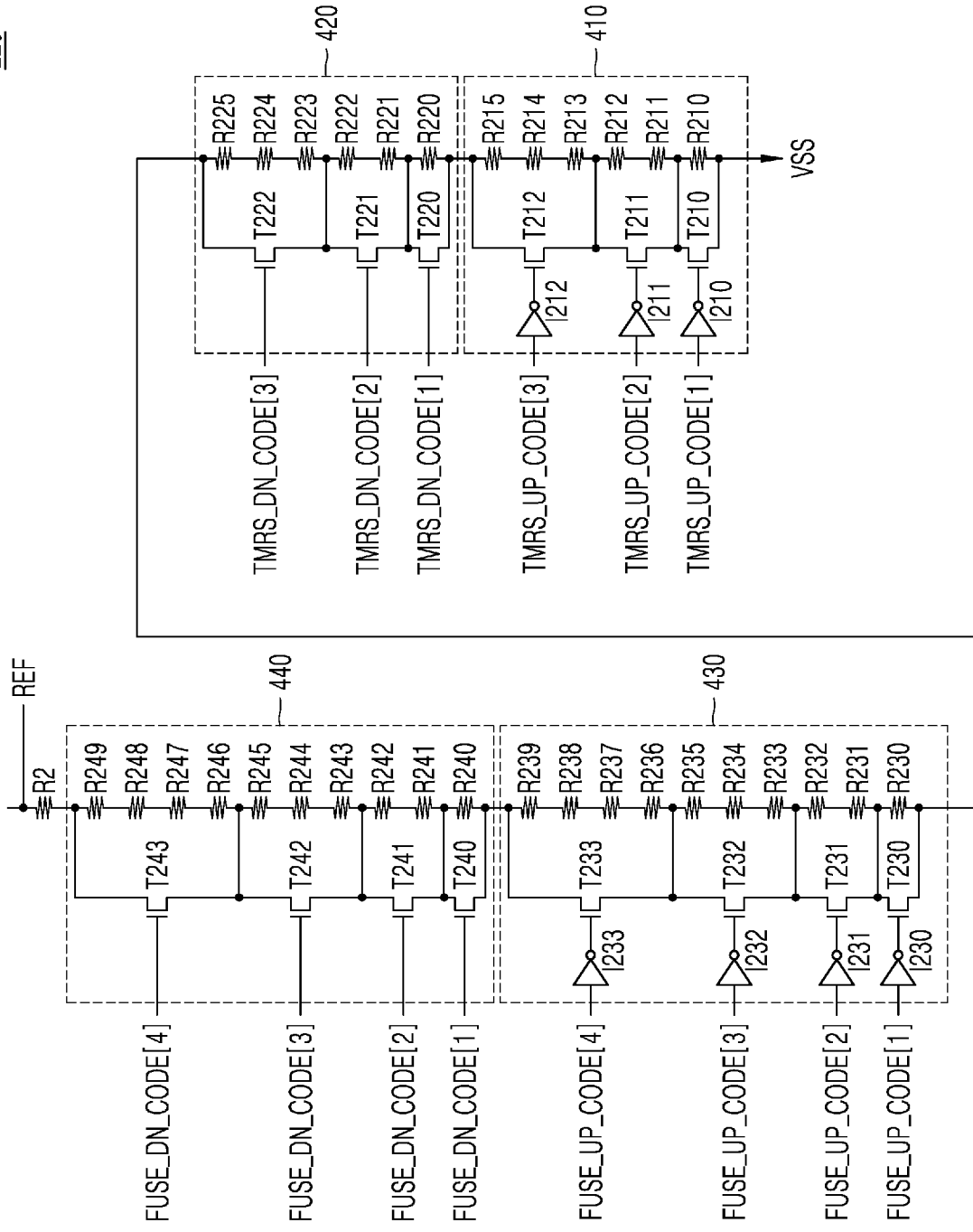
FIG. 4 is a circuit diagram describing in detail a second resistance circuit unit in FIG. 2.

FIGS. 3 and 4 are circuit diagrams describing in detail the first and second resistance circuit units in FIG. 2. FIG. 3 illustrates the first resistance circuit unit 210, and FIG. 4 illustrates the second resistance circuit unit 220.

Referring to FIGS. 2 and 3, the first resistance circuit unit 210 may include the first command up resistance circuit 310, the first command down resistance circuit 320, the first fuse up resistance circuit 330, the first fuse down resistance circuit 340, and the first resistor 350 (shown in FIG. 3 as R1), which are connected to each other in series between the reference voltage VREF line and the reference voltage trimming node REF.

The first command up resistance circuit 310 may include resistors R110, R111, R112, R113, R114 and R115 connected to each other in series and transistors T110, T111 and T112 connected to each other in series. The transistor T110 may be connected to both ends of the resistor R110, the transistor T11 may be connected to ends of the resistors R111 and R112 connected to each other in series, and the transistor T112 may be connected to ends of the resistors R113 through R115 connected to each other in series. A command up code TMRS_UP_CODE[3:1] may be provided to gates of the transistors T110 through T112. An initial value of the command up code TMRS_UP_CODE[3:1] may be 000.

When the test host 12 adjusts the command up code TMRS_UP_CODE[3:1], transistor(s) corresponding to a code value of 1 of the command up code TMRS_UP_CODE[3:1] may be turned on. The turned on transistor(s) may indicate that the internal switch SW310 of the first command up resistance circuit 310 described with reference to FIG. 2 is on. When resistor(s) on both ends of the turned on transistor(s) are shorted and the first command up resistance value $R1_{TMRS\_UP}$ the first command up resistance circuit 310 is decreased, the voltage level of the reference voltage trimming node REF may be increased.

Each of the command up codes TMRS_UP_CODE[3:1] may set a different size of the reference voltage trimming node REF voltage level. In the present embodiment, a command up code TMRS_UP_CODE[3], the most significant bit, may generate the largest magnitude increase of the reference voltage trimming node REF, and a command up code TMRS_UP_CODE[1], the least significant bit, may generate the smallest magnitude increase of the reference voltage trimming node REF.

The first command down resistance circuit 320 may include resistors R120, R121, R122, R123, R124 and R125 connected to each other in series, and transistors T120, T121 and T122 and inverters 1120, 1121 and 1122 connected to each other in series. The transistor T120 may be connected to both ends of the resistor R120, the transistor T121 may be connected to ends of the resistors R121 and R122 connected to each other in series, and the transistor T122 may be connected to ends of the resistors R123 through R125 connected to each other in series. A gate of each of the transistors T120 through T122 may be connected to an output of each of the inverters 1120 through 1122. The command down code TMRS_DN_CODE[3:1] may be provided to an input of the inverters 1120 through 1122. An initial value of the command down code TMRS_DN_CODE[3:1] may be 000.

When the test host 12 adjusts the command down code TMRS_DN_CODE[3:1], transistor(s) corresponding to a code value of 1 of the command down code TMRS_DN_CODE[3:1] may be turned off. The turned off transistor (s) may indicate that the internal switch SW320 of the first command down resistance circuit 320 described with reference to FIG. 2 is off. When the first command down resistance value $R1_{TMRS\_DN}$ of the first command down resistance circuit 320 is increased by resistor(s) on both ends of the turned off transistor(s), the voltage level of the reference voltage trimming node REF may be decreased.

Each of the command down codes TMRS_DN_CODE[3:1] may set a different size of the reference voltage trimming node REF voltage level. In the present embodiment, a command down code TMRS_DN_CODE[3], the most significant bit, may generate the largest magnitude decrease of the reference voltage trimming node REF, and a command down code TMRS_UP_CODE[1], the least significant bit, may generate the smallest magnitude decrease of the reference voltage trimming node REF.

The first fuse up resistance circuit 330 may include resistors R130, R131, R132, R133, R134, R135, R136, R137, R138 and R139 connected to each other in series and transistors T130, T131, T132 and T133, which are connected to each other in series. The transistor T130 may be connected to both ends of the resistor R130, the transistor T131 may be connected to ends of the resistors R131 and R132 connected to each other in series, the transistor T132 may be connected to ends of the resistors R133 through R135 connected to each other in series, and the transistor T133 may be connected to ends of the resistors R136 through R139 connected to each other in series. A fuse up code FUSE_UP_CODE[4:1] may be provided to gates of the transistors T130 through T133. An initial value of the fuse up code FUSE_UP_CODE[4:1] may be 0000.

When the test host 12 adjusts the fuse up code FUSE_UP_CODE[4:1], transistor(s) corresponding to a code value of 1 of the fuse up code FUSE_UP_CODE[4.1] may be turned on. The turned on transistor(s) may indicate that the internal switch SW330 of the first fuse up resistance circuit 330 described with reference to FIG. 2 is on. When resistor(s) on both ends of the turned on transistor(s) are shorted and the first fuse up resistance value $R1_{FUSE\_UP}$ the first fuse up resistance circuit 330 is decreased, the voltage level of the reference voltage trimming node REF may be increased.

Each of the fuse up codes FUSE_UP_CODE[4:1] may set a different size of the reference voltage trimming node REF voltage level. In the present embodiment, a fuse up code FUSE_UP_CODE[4], the most significant bit, may generate the largest magnitude increase of the reference voltage trimming node REF, and a fuse up code FUSE_UP_CODE[1], the least significant bit, may generate the smallest magnitude increase of the reference voltage trimming node REF.

The first fuse down resistance circuit 340 may include resistors R140, R141, R142, R143, R144, R145, R146, R147, R148 and R149 connected to each other in series, and transistors T140, T141, T142 and T143 and inverters 1140, 1141, 1142 and 1143, which are connected to each other in series. The transistor T140 may be connected to both ends of the resistor R140, the transistor T141 may be connected to ends of the resistors R141 and R142 connected to each other in series, the transistor T142 may be connected to ends of the resistors R143 through R145 connected to each other in series, and the transistor T143 may be connected to ends of the resistors R146 through R149 connected to each other in series. A gate of each of the transistors T140 through T143 may be connected to an output of each of the inverters 1140 through 1143. The fuse down code FUSE_DN_CODE[4:1] may be provided to an input of the inverters 1140 through 1143. An initial value of the fuse down code FUSE_DN_CODE[4:1] may be 0000.

When the test host 12 adjusts the fuse down code FUSE_DN_CODE[4:1], transistor(s) corresponding to a code value of 1 of the fuse down code FUSE_DN_CODE[4:1] may be turned off. The turned off transistor(s) may indicate that the internal switch SW340 of the first fuse down resistance circuit 340 described with reference to FIG. 2 is off. When the first fuse down resistance value $R1_{FUSE\_DN}$ of the first fuse down resistance circuit 340 is increased by resistor(s) on both ends of the turned off transistor(s), the voltage level of the reference voltage trimming node REF may be decreased.

Each of the fuse down codes FUSE_DN_CODE[4:1] may set a different size of the reference voltage trimming node REF voltage level. In the present embodiment, a fuse down code FUSE_DN_CODE[4], the most significant bit, may generate the largest magnitude decrease of the reference voltage trimming node REF, and a fuse down code FUSE_DN_CODE[1], the least significant bit, may generate the smallest magnitude decrease of the reference voltage trimming node REF.

Referring to FIGS. 2 and 4, the second resistance circuit unit 220 may include the second resistor 450 (shown as R2), the second fuse down resistance circuit 440, the second fuse up resistance circuit 430, the second command down resistance circuit 420, and the second command up resistance circuit 410, which are connected to each other in series between the reference voltage trimming node REF and the ground voltage VSS line.

The second fuse down resistance circuit 440 may include resistors R240, R241, R242, R243, R244, R245, R246, R247, R248 and R249 connected to each other in series and transistors T240, T241, T242 and T243, which are connected to each other in series. The transistor T240 may be connected to both ends of the resistor R240, the transistor T241 may be connected to ends of the resistors R241 and R242 connected to each other in series, the transistor T242 may be connected to ends of the resistors R243 through R245 connected to each other in series, and the transistor T243 may be connected to ends of the resistors R246 through R249 connected to each other in series. A fuse down code FUSE_DN_CODE[4:1] may be provided to gates of the transistors T240 through T243.

When the test host 12 adjusts the fuse down code FUSE_DN_CODE[4:1], transistor(s) corresponding to a code value of 1 of the fuse down code FUSE_DN_CODE[4:1] may be turned on. The turned on transistor(s) may indicate that the internal switch SW440 of the second fuse down resistance circuit 440 described with reference to FIG. 2 is on. When resistor(s) on both ends of the turned off transistor(s) are shorted and the second fuse down resistance value $R2_{FUSE\_DN}$ of the second fuse down resistance circuit 440 is decreased, the voltage level of the reference voltage trimming node REF may be decreased.

The second fuse up resistance circuit 430 may include resistors R230, R231, R232, R233, R234, R235, R236, R237, R238 and R239 connected to each other in series, and transistors T230, T231, T232 and T233 and inverters 1230, 1231, 1232 and 1233, which are connected to each other in series. The transistor T230 may be connected to both ends of the resistor R230, the transistor T231 may be connected to ends of the resistors R231 and R232 connected to each other in series, the transistor T232 may be connected to ends of the resistors R233 through R235 connected to each other in series, and the transistor T233 may be connected to ends of the resistors R236 through R239 connected to each other in series. A gate of each of the transistors T230 through T233 may be connected to an output of each of the inverters 1230 through 1233. The fuse up code FUSE_UP_CODE[4:1] may be provided to an input of the inverters 1230 through 1233.

When the test host 12 adjusts the fuse up code FUSE_UP_CODE[4:1], transistor(s) corresponding to a code value of 1 of the fuse up code FUSE_UP_CODE[4:1] may be turned off. The turned off transistor(s) may indicate that the internal switch SW430 of the second fuse up resistance circuit 430 described with reference to FIG. 2 is off. When the second fuse up resistance value $R2_{FUSE\_UP}$ of the second fuse up resistance circuit 430 is increased by resistor(s) on both ends of the turned off transistor(s), the voltage level of the reference voltage trimming node REF may be decreased.

The second command down resistance circuit 420 may include resistors R220, R221, R223, R224 and R225 connected to each other in series and transistors T220, T221 and T222, which are connected to each other in series. The transistor T220 may be connected to both ends of the resistor R220, the transistor T221 may be connected to ends of the resistors R221 and R222 connected to each other in series, and the transistor T222 may be connected to ends of the resistors R223 through R225 connected to each other in series. A command down code TMRS_DN_CODE[3.1] may be provided to gates of the transistors T220 through T222.

When the test host 12 adjusts the command down code TMRS_DN_CODE[3:1], transistor(s) corresponding to a code value of 1 of the command down code TMRS_DN_CODE[3:1] may be turned on. The turned on transistor(s) may indicate that the internal switch SW420 of the second command down resistance circuit 420 described with reference to FIG. 2 is on. When resistor(s) of both ends of the turned on transistor(s) are shorted and the second command down resistance value $R2_{TMRS\_DN}$ of the second command down resistance circuit 420 is decreased, the voltage level of the reference voltage trimming node REF may be decreased.

The second command up resistance circuit 410 may include resistors R210, R211, R212, R213, R214 and R215 connected to each other in series, and transistors T210, T211 and T212 and inverters 1210, 1211 and 1212, which are connected to each other in series. The transistor T210 may be connected to both ends of the resistor R210, the transistor T211 may be connected to ends of the resistors R211 and R212 connected to each other in series, and the transistor T212 may be connected to ends of the resistors R213 through R215 connected to each other in series. A gate of each of the transistors T210 through T212 may be connected to an output of each of the inverters 1210 through 1212. The command up code TMRS_UP_CODE[3:1] may be provided to an input of the inverters 1210 through 1212.

When the test host 12 adjusts the command up code TMRS_UP_CODE[3:1], transistor(s) corresponding to a code value of 1 of the command up code TMRS_UP_CODE [3:1] may be turned off. The turned off transistor(s) may indicate that the internal switch SW410 of the second command up resistance circuit 410 described with reference to FIG. 2 is off. When the second command up resistance value $R2_{TMRS\_UP}$ of the second command up resistance circuit 410 is increased by resistor(s) on both ends of the turned off transistor(s), the voltage level of the reference voltage trimming node REF may be increased.

Figure 5:
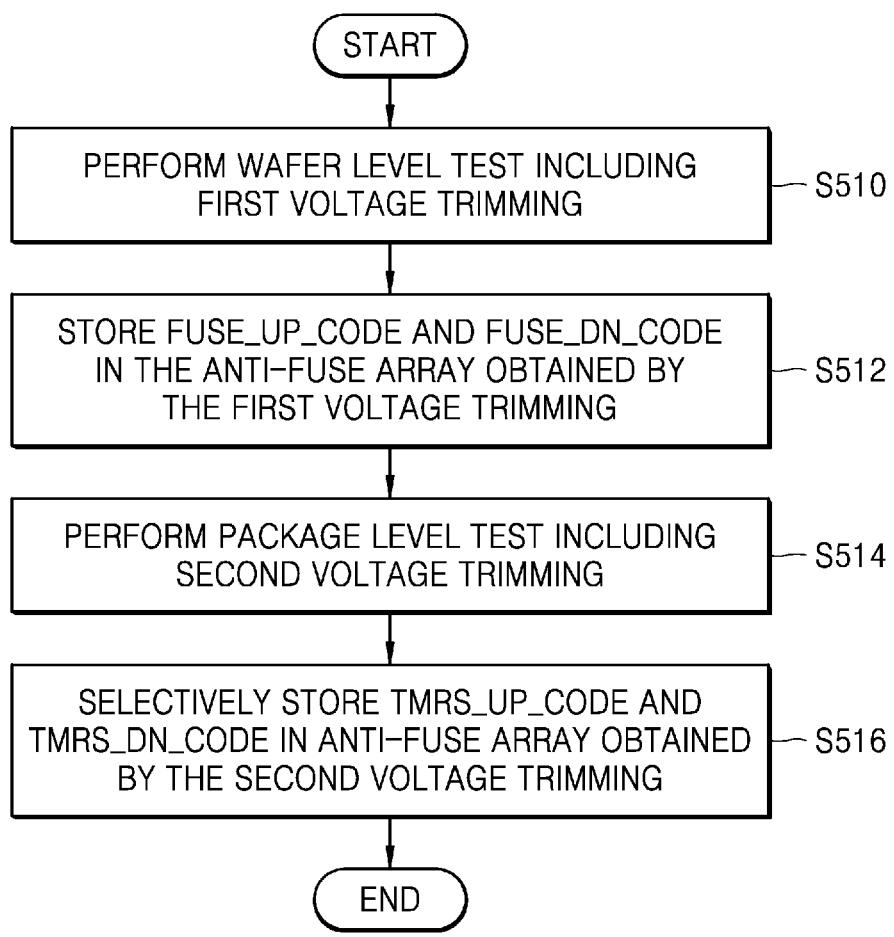
FIG. 5 is a flowchart of a test method of the memory device of FIG. 1.

FIG. 5 is a flowchart of a test method of the memory device of FIG. 1.

Referring to FIGS. 1, 2, and 5, the test device 10 may perform a wafer level test on the memory device 20 (S510). The test host 12 of the test device 10 may test the wafer level performance of the memory device 20, and perform the first voltage trimming operation by using the voltage trimming circuit 23. The wafer level performance test may include a leakage current test, a write/read test, a voltage/current/ frequency test, or the like on the memory device 20. The test host 12 may adjust the fuse up code FUSE_UP_CODE and/or the fuse down code FUSE_DN_CODE so that the voltage level of the reference voltage trimming node REF is set to the voltage level of the feedback node FB based on the voltage detection signal VPPDET output by the voltage trimming circuit 23. In this case, the voltage level of the feedback node FB may have the voltage level distributed from the high voltage VPP of the target voltage level generated by the voltage generation circuitry 21.

The memory device 20 may receive the fuse up code FUSE_UP_CODE and/or the fuse down code FUSE_DN_CODE obtained as first voltage trimming results in operation S510, and store the fuse up code FUSE_UP_CODE and/or the fuse down code FUSE_DN_CODE in the anti-fuse array 25 (S512).

The test device 10 may perform a package level test on the memory device 20 (S514). The test host 12 of the test device 10 may test the package level performance of the memory device 20, and perform the second voltage trimming operation by using the voltage trimming circuit 23. The package level performance test may include a low frequency performance test, a high frequency performance test, or the like on the memory device 20. The test host 12 may adjust the command up code TMRS_UP_CODE and/or the command down code TMRS_DN_CODE so that the voltage level of the reference voltage trimming node REF is set to the voltage level of the feedback node FB based on the voltage detection signal VPPDET output by the voltage trimming circuit 23. In this case, the voltage level of the feedback node FB may have a voltage level distributed from the high voltage VPP of a target voltage level range that has certain positive (+) and/or negative (−) ranges with the target voltage level generated by the voltage generation circuitry 21 as a reference.

The test device 10 may selectively transmit, to the memory device 20, the command up code TMRS_UP_CODE and/or the command down code TMRS_DN_CODE obtained as a result of second voltage trimming operation (S514). The memory device 20 may selectively store the command up code TMRS_UP_CODE and/or the command down code TMRS_DN_CODE in the anti-fuse array 25 (S516).

Figure 6:
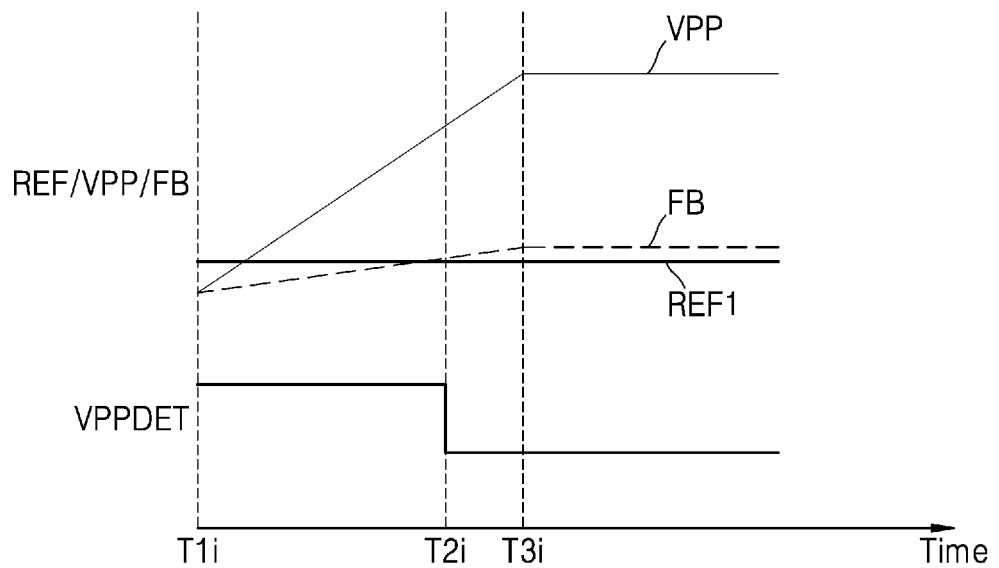
FIG. 6 is an example timing diagram of an operation prior to a first voltage trimming operation in FIG. 5.
Figure 7:
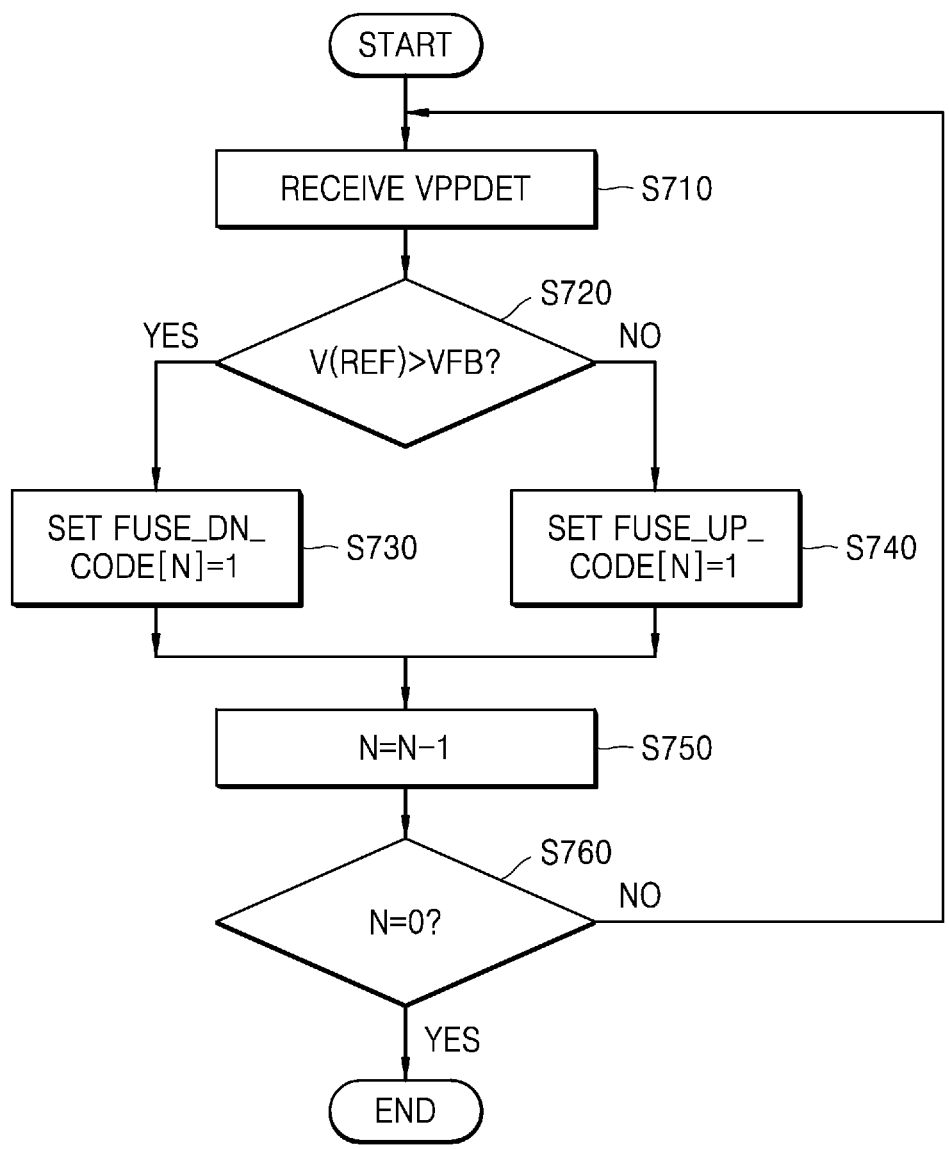
FIG. 7 is an example flowchart of the first voltage trimming operation in FIG. 5.
Figure 8:
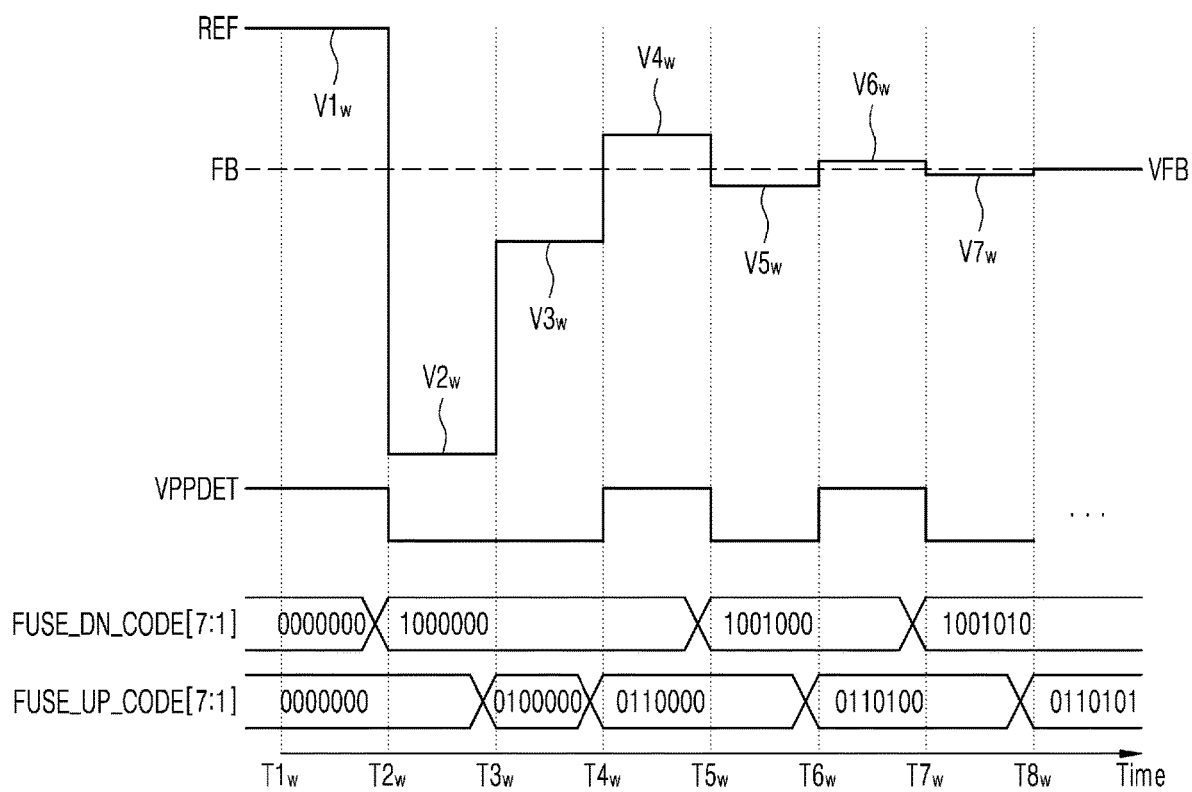
FIG. 8 is an example timing diagram of the first voltage trimming operation in FIG. 5.

FIGS. 6 through 8 are diagrams describing the first voltage trimming operation in FIG. 5. Hereinafter, the fuse up code FUSE_UP_CODE and command up code TMRS_UP_CODE may be referred to as up codes and the fuse down code FUSE_DN_CODE and command down code TMRS_DN_CODE may be referred to as down codes.

FIG. 6 is a timing diagram of the voltage trimming circuit 23 when the up codes FUSE_UP_CODE[N:1] and TMRS_UP_CODE[N:1], and down codes FUSE_DN_CODE[N:1] and TMRS_DN_CODE[N:1] have initial values before the first voltage trimming operation is performed. In FIG. 6, the horizontal axis may be time. Below, for convenience of description, N in the up codes FUSE_UP_CODE[N:1] and TMRS_UP_CODE[N:1] and the down codes FUSE_DN_CODE[N:1] and TMRS_DN_CODE[N:1] is assumed to be 7. In addition, it is assumed that a magnitude increase of the voltage level of the reference voltage trimming node REF, caused by each of the up codes FUSE_UP_CODE[N: 1] and TMRS_UP_CODE[N:1], is proportional to 2 to N times, and it is assumed that a magnitude increase of the voltage level of the reference voltage trimming node REF, caused by each of the down codes FUSE_DN_CODE[N:1] and TMRS_DN_CODE[N:1], is proportional to 2 to N times.

Referring to FIGS. 1, 2, and 6, when the initial values of the up codes FUSE_UP_CODE[N:1] and TMRS_UP_CODE[N:1] and down codes FUSE_DN_CODE[N:1] and TMRS_DN_CODE[N:1] are 0000000, the voltage level of the reference voltage trimming node REF may be a first voltage level REF1. The high voltage VPP may be increased by the voltage generation circuitry 21, and may be generated as the target voltage level at a time point T3$i$.

From a time point T1$i$ to a time point T2$i$, the voltage level of the feedback node FB may be distributed from a rising high voltage VPP, and may be lower than the voltage level of the reference voltage trimming node REF. Accordingly, the voltage detection signal VPPDET of the comparator 230 may be at a logic high level. In other words, since the voltage level of the reference voltage trimming node REF is higher than the voltage level of the feedback node FB, the voltage detection signal VPPDET of the comparator 230 is at the logic high level.

From the time point T2$i$ to the time point T3$i$, the voltage level of the feedback node FB distributed from the high voltage VPP may be higher than the voltage level of the reference voltage trimming node REF. Accordingly, the voltage detection signal VPPDET of the comparator 230 may be at a logic low level. In other words, since the voltage level of the reference voltage trimming node REF is less than the voltage level of the feedback node FB, the voltage detection signal VPPDET of the comparator 230 is at the logic low level.

FIG. 7 is an example flowchart of the first voltage trimming operation. When the target voltage level of the high voltage VPP is changed according to each process change of the memory device 20 in the wafer state, the voltage level of the feedback node FB may also be changed. In FIG. 7, the first voltage trimming operation for setting the voltage level of the reference voltage trimming node REF to the changed voltage level of the feedback node FB during the wafer test is illustrated.

Referring to FIGS. 1, 2, and 7, the test host 12 of the test device 10 may receive the voltage detection signal VPPDET from the comparator 230 of the voltage trimming circuit 23 (S710).

The test host 12 may perform operation S730, when a voltage level V(REF) of the reference voltage trimming node REF is higher than a voltage level VFB of the feedback node FB (YES) (S720). The test host 12 may perform operation S740, when the voltage level V(REF) of the reference voltage trimming node REF is equal to or lower than the voltage level VFB of the feedback node FB (NO).

When the voltage level V(REF) of the reference voltage trimming node REF is higher than the voltage level VFB of the feedback node FB, the test host 12 may set a fuse down code FUSE_DN_CODE[N] to 1 (S730). When the voltage level V(REF) of the reference voltage trimming node REF is equal to or lower than the voltage level VFB of the feedback node FB, the test host 12 may set a fuse up code FUSE_UP_CODE[N] to 1 (S740).

In this case that the N$^{th}$ fuse down code FUSE_DN_CODE[N] is set in operation S730, the test host 12 may prepare to set the (N−1)$^{th}$ fuse down code FUSE_DN_CODE[N−1] (S750) and, in the case that the N$^{th}$ fuse up code FUSE_UP_CODE[N] is set in operation S740, the test host 12 may prepare to set the (N−1)$^{th}$ fuse up code FUSE_UP_CODE[N−1] (S750).

The test host 12 may determine whether all of the fuse down code FUSE_DN_CODE[N:1] and the fuse up code FUSE_UP_CODE[N:1] have been used, in other words, whether N=0 (S760). When all of the fuse down code FUSE_DN_CODE[N:1] and the fuse up code FUSE_UP_CODE[N:1] have been used (YES), after the set fuse down code FUSE_DN_CODE[N:1] and fuse up code FUSE_UP_CODE[N:1] are stored in the anti-fuse array 25 of the memory device 20, the first voltage trimming operation may be terminated. When all of the fuse down code FUSE_DN_CODE[N:1] and the fuse up code FUSE_UP_CODE[N:1] have not been used (NO), the first voltage trimming operation may continue. In other words, the test host 12 may repeatedly perform operations S710 through S750.

FIG. 8 is an example timing diagram of the first voltage trimming operation. In FIG. 8, the horizontal axis may be time.

Referring to FIGS. 1, 2, 7, and 8, from a time point T1$_w$ to a time point T2$_w$, an initial voltage level of the reference voltage trimming node REF may be a first voltage level V1$_w$. The first voltage level V1$_w$ of the reference voltage trimming node REF may be higher than the voltage level VFB of the feedback node FB. Accordingly, the voltage detection signal VPPDET of the comparator 230 may be at a logic high level. The test host 12 may adjust a fuse down code FUSE_DN_CODE[7:1] to decrease the voltage level of the reference voltage trimming node REF. For example, the fuse down code FUSE_DN_CODE[7:1] may change from 0000000 to 1000000. In other words, test host 12 may change first the fuse down code FUSE_DN_CODE[7], in other words, the most significant bit, to cause the greatest magnitude decrease in the voltage level of the reference voltage trimming node REF. More specifically, the test host 12 may set to 1 the fuse down code FUSE_DN_CODE[7], or the most significant bit of the fuse down code FUSE_DN_CODE[7:1], ahead of the time point T2$_w$ (S730). In this case, the voltage level of the reference voltage trimming node REF may be decreased from the first voltage level V1$_w$ to a second voltage level V2$_w$.

From the time point T2$_w$ to a time point T3$_w$, the second voltage level V2$_w$ of the reference voltage trimming node REF may be lower than the voltage level VFB of the feedback node FB. Accordingly, the voltage detection signal VPPDET of the comparator 230 may be at a logic low level. The test host 12 may adjust a fuse up code FUSE_UP_CODE[7.1] to increase the voltage level of the reference voltage trimming node REF. In this case, when the fuse up code FUSE_UP_CODE[7], e.g., the most significant bit, is set to 1, the voltage level of the reference voltage trimming node REF may return to near the voltage level from the time point T1$_w$ to the time point T2$_w$. Accordingly, the test host 12 may set to 1 a fuse up code FUSE_UP_CODE[6] instead of the fuse up code FUSE_UP_CODE[7] (S740). As a consequence, the voltage level of the reference voltage trimming node REF may be increased from the second voltage level V2$_w$ to a third voltage level V3$_w$.

From the time point T3$_w$ to a time point T4$_w$, the third voltage level V3$_w$ of the reference voltage trimming node REF may still be lower than the voltage level VFB of the feedback node FB regardless of the prior adjustment made by the test host 12. Accordingly, the voltage detection signal VPPDET of the comparator 230 may still be at a logic low level. The test host 12 may adjust again the fuse up code FUSE_UP_CODE[7:1] to increase the voltage level of the reference voltage trimming node REF. As an example, the test host 12 may set a fuse up code FUSE_UP_CODE[5] to 1 (S740). In this case, the voltage level of the reference voltage trimming node REF may be increased from the third voltage level $V3_w$ to a fourth voltage level $V4_w$.

From the time point $T4_w$ to a time point $T5_w$, the fourth voltage level $V4_w$ of the reference voltage trimming node REF may be higher than the voltage level VFB of the feedback node FB. Accordingly, the voltage detection signal VPPDET of the comparator 230 may be at a logic high level. The test host 12 may adjust again the fuse down code FUSE_DN_CODE[7:1] to decrease the voltage level of the reference voltage trimming node REF. As an example, the test host 12 may set a fuse down code FUSE_DN_CODE[4] to 1 (S730). In this case, the voltage level of the reference voltage trimming node REF may be decreased from the fourth voltage level $V4_w$ to the fifth voltage level $V5_w$.

From the time point $T5_w$ to a time point $T6_w$, the fifth voltage level $V5_w$ of the reference voltage trimming node REF may be lower than the voltage level VFB of the feedback node FB. Accordingly, the voltage detection signal VPPDET of the comparator 230 may be at a logic low level. The test host 12 may adjust again the fuse up code FUSE_UP_CODE[7:1], to increase the voltage level of the reference voltage trimming node REF. As an example, the test host 12 may set a fuse up code FUSE_UP_CODE[3] to 1 (S740). In this case, the voltage level of the reference voltage trimming node REF may be increased from the fifth voltage level $V5_w$ to the sixth voltage level $V6_w$.

From the time point $T6_w$ to a time point $T7_w$, the sixth voltage level $V6_w$ of the reference voltage trimming node REF may be higher than the voltage level VFB of the feedback node FB. Accordingly, the voltage detection signal VPPDET of the comparator 230 may be at a logic high level. The test host 12 may adjust again the fuse down code FUSE_DN_CODE[7:1] to decrease the voltage level of the reference voltage trimming node REF. As an example, the test host 12 may set a fuse down code FUSE_DN_CODE[2] to 1 (S730). In this case, the voltage level of the reference voltage trimming node REF may be decreased from the sixth voltage level $V6_w$ to a seventh voltage level $V7_w$.

From the time point $T7_w$ to a time point $T8_w$, the seventh voltage level $V7_w$ of the reference voltage trimming node REF may be lower than the voltage level VFB of the feedback node FB. Accordingly, the voltage detection signal VPPDET of the comparator 230 may be at a logic low level. The test host 12 may adjust again the fuse up code FUSE_UP_CODE[7:1] to increase the voltage level of the reference voltage trimming node REF. As an example, the test host 12 may set a fuse up code FUSE_UP_CODE[1] to 1 (S740). In this case, the voltage level of the reference voltage trimming node REF may be increased from the seventh voltage level $V7_w$ to the voltage level VFB of the feedback node FB.

From the time point $T1_w$ to the time point $T8_w$, the test host 12 may adjust the fuse down code FUSE_DN_CODE[7:1] and the fuse up code FUSE_UP_CODE[7:1]. After the time point $T8_w$, the fuse down code FUSE_DN_CODE[7:1], e.g., 1001010, and the fuse up code FUSE_UP_CODE[7:1], e.g., 0110101, may be stored in the anti-fuse array 25. In other words, the fuse down code FUSE_DN_CODE[7:1], e.g., 1001010, and the fuse up code FUSE_UP_CODE[7:1], e.g., 0110101, may be programmed in the anti-fuse array 25. In this case, a program may include a rupture operation in which an anti-fuse is changed from a high resistance state to a low resistance state by an electrical signal. The anti-fuses corresponding to a code of 1 of the fuse down code FUSE_DN_CODE[7:1] and the fuse up code FUSE_UP_CODE[7:1] may be ruptured, and the anti-fuses corresponding to a code of 0 of the fuse down code FUSE_DN_CODE[7:1] and the fuse up code FUSE_UP_CODE[7:1] may not be ruptured.

Figure 9:
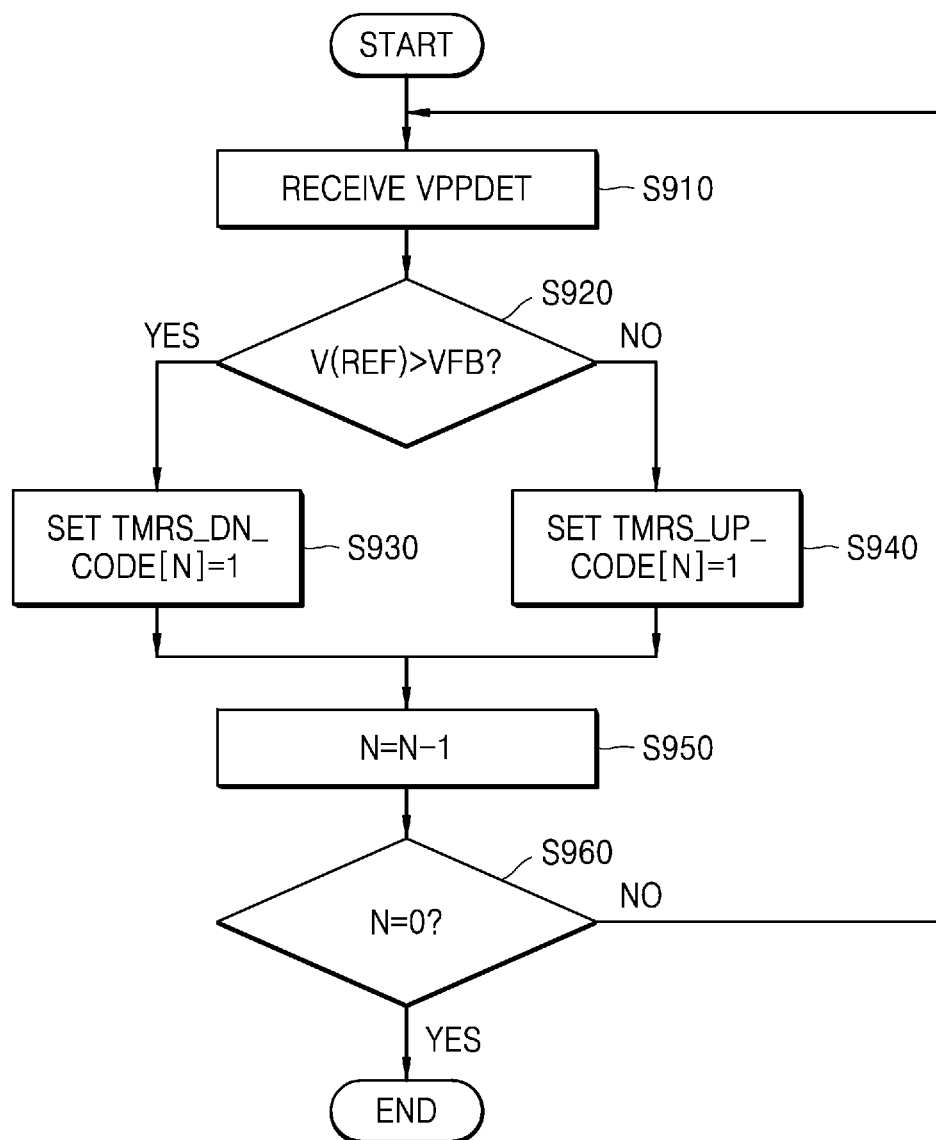
FIG. 9 is an example flowchart of a second voltage trimming operation in FIG. 5.
Figure 10:
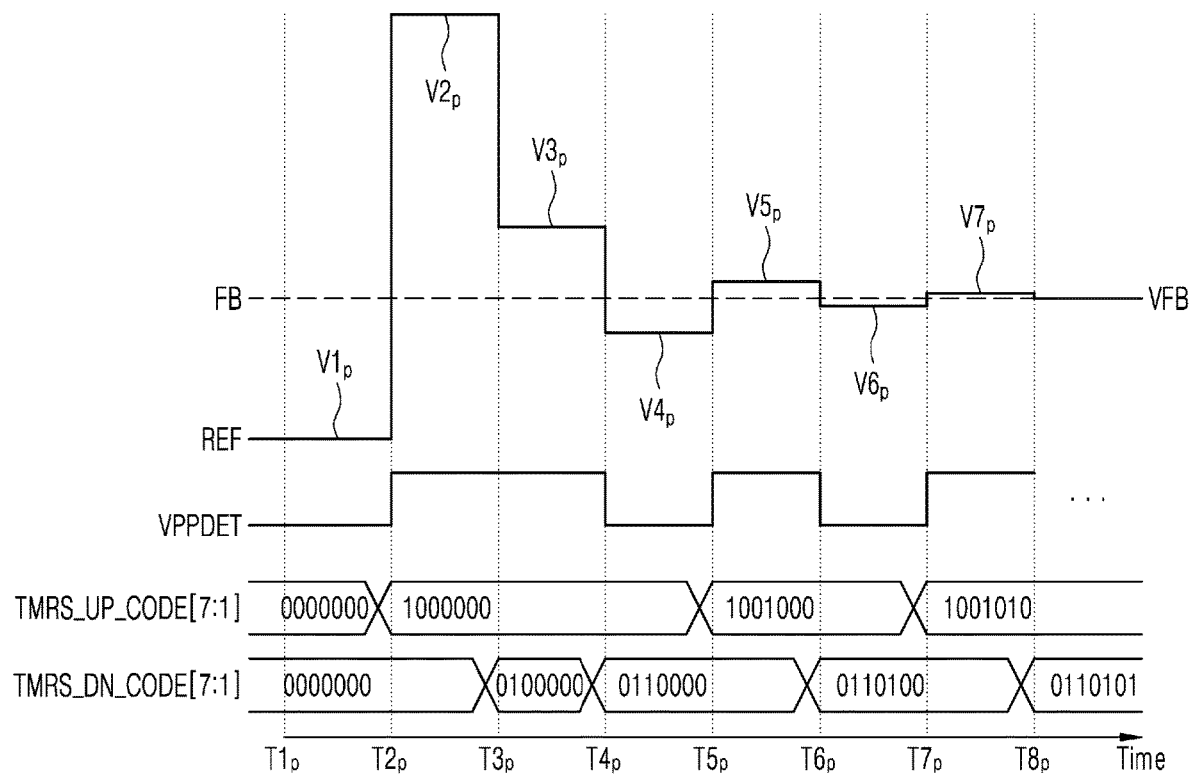
FIG. 10 is an example timing diagram of the second voltage trimming operation in FIG. 5.

FIGS. 9 and 10 are diagrams describing the second voltage trimming operation in FIG. 5.

FIG. 9 is an example flowchart of the second voltage trimming operation. To evaluate and accelerate the range of the target voltage level in the package level performance test of the memory device 20, the high voltage VPP may be changed to the target voltage level range having certain positive (+) and/or negative (−) ranges with the target voltage level as a reference, and accordingly, the voltage level of the feedback node FB may be changed. In FIG. 9, the second voltage trimming operation for setting the voltage level of the reference voltage trimming node REF to the changed voltage level of the feedback node FB during the package test is illustrated.

Referring to FIGS. 1, 2, and 9, the test host 12 of the test device 10 may receive the voltage detection signal VPPDET from the comparator 230 of the voltage trimming circuit 23 (S910).

The test host 12 may perform operation S930, when a voltage level V(REF) of the reference voltage trimming node REF is higher than a voltage level VFB of the feedback node FB (YES) (S920). The test host 12 may perform operation S940, when the voltage level V(REF) of the reference voltage trimming node REF is equal to or lower than the voltage level VFB of the feedback node FB (NO).

When the voltage level V(REF) of the reference voltage trimming node REF is higher than the voltage level VFB of the feedback node FB, the test host 12 may set the command down code TMRS_DN_CODE[N] to 1 (S930). When the voltage level V(REF) of the reference voltage trimming node REF is lower than the voltage level VFB of the feedback node FB, the test host 12 may set the command up code TMRS_UP_CODE[N] to 1 (S940).

Because the Nth command down code TMRS_DN_CODE[N] and command up code TMRS_UP_CODE[N] may be set in operations S930 and S940, the test host 12 may prepare to set $(N-1)^{th}$ command down code TMRS_DN_CODE[N−1] and $(N-1)^{th}$ command up code TMRS_UP_CODE[N−1] (S950).

The test host 12 may determine whether all of the command down code TMRS_DN_CODE[N:1] and the command up code TMRS_UP_CODE[N:1] have been used, in other words, whether N=0 (S960). When all of the command down code TMRS_DN_CODE[N:1] and the command up code TMRS_UP_CODE[N:1] have been used (YES), a second voltage trimming operation may be terminated. According to an embodiment of the present invention, the command down code TMRS_DN_CODE[N:1] and the command up code TMRS_UP_CODE[N:1] according to the second voltage trimming operation may be selectively stored in the anti-fuse array 25 of the memory device 20. When all of the command down code TMRS_DN_CODE[N:1] and the command up code TMRS_UP_CODE[N:1] have not been used (NO), the second voltage trimming operation may be continuously progressed. In other words, the test host 12 may repeatedly perform operations S910 through S950.

FIG. 10 is an example timing diagram of the second voltage trimming operation. In FIG. 10, the horizontal axis may be time.

Referring to FIGS. 1, 2, 9, and 10, from a time point $T1_p$ to a time point $T2_p$, an initial voltage level of the reference voltage trimming node REF may be a first voltage level $V1_p$. The first voltage level $V1_p$ of the reference voltage trimming node REF may be lower than the voltage level VFB of the feedback node FB. Accordingly, the voltage detection signal VPPDET of the comparator 230 may be at a logic low level. The test host 12 may adjust a command up code TMRS_UP_CODE[7:1] to increase the voltage level of the reference voltage trimming node REF. The test host 12 may control first a command up code TMRS_UP_CODE[7], in other words, the most significant bit of the command up code TMRS_UP_CODE[7:1], causing the greatest magnitude increase of the voltage level of the reference voltage trimming node REF. The test host 12 may set to 1 the command up code TMRS_UP_CODE[7], or the most significant bit of the command up code TMRS_UP_CODE[7:1], ahead of the time point T$2_p$ (S940). Here, the command up code TMRS_UP_CODE[7:1] may be 1000000. The voltage level of the reference voltage trimming node REF may then be increased from the first voltage level V$1_p$ to a second voltage level V$2_p$.

From the time point T$2_p$ to a time point T$3_p$, the second voltage level V$2_p$ of the reference voltage trimming node REF may be higher than the voltage level VFB of the feedback node FB. Accordingly, the voltage detection signal VPPDET of the comparator 230 may be at a logic high level. The test host 12 may adjust a command down code TMRS_DN_CODE[7:1] to decrease the voltage level of the reference voltage trimming node REF. Accordingly, the test host 12 may set a command down code TMRS_DN_CODE[6] to 1 (S930). The voltage level of the reference voltage trimming node REF may then be decreased from the second voltage level V$2_p$ to a third voltage level V$3_p$.

From the time point T$3_p$ to a time point T$4_p$, the third voltage level V$3_p$ of the reference voltage trimming node REF may still be higher than the voltage level VFB of the feedback node FB even after the previous adjustment effectuated by the test host 12. Accordingly, the voltage detection signal VPPDET of the comparator 230 may still be at a logic high. The test host 12 may adjust again the command down code TMRS_DN_CODE[7.1] to decrease the voltage level of the reference voltage trimming node REF. As an example, the test host 12 may set a command down code TMRS_DN_CODE[5] to 1 (S930). The voltage level of the reference voltage trimming node REF may then be decreased from the third voltage level V$3_p$ to a fourth voltage level V$4_p$.

From the time point T$4_p$ to a time point T$5_p$, the fourth voltage level V$4_p$ of the reference voltage trimming node REF may be lower than the voltage level VFB of the feedback node FB. Accordingly, the voltage detection signal VPPDET of the comparator 230 may be at a logic low level. The test host 12 may adjust again the command up code TMRS_UP_CODE[7:1] to increase the voltage level of the reference voltage trimming node REF. As an example, the test host 12 may set a command up code TMRS_UP_CODE[4] to 1 (S940). Here, the command up code TMRS_UP_CODE[7:1] may be 1001000. The voltage level of the reference voltage trimming node REF may then be increased from the fourth voltage level V$4_p$ to a fifth voltage level V$5_p$.

From the time point T$5_p$ to a time point T$6_p$, the fifth voltage level V$5_p$ of the reference voltage trimming node REF may be higher than the voltage level VFB of the feedback node FB. Accordingly, the voltage detection signal VPPDET of the comparator 230 may be at a logic high level. The test host 12 may adjust again the command down code TMRS_DN_CODE[7:1] to decrease the voltage level of the reference voltage trimming node REF. As an example, the test host 12 may set a command down code TMRS_DN_CODE[3] to 1 (S930). The voltage level of the reference voltage trimming node REF may then be decreased from the fifth voltage level V$5_p$ to a sixth voltage level V$6_p$.

From the time point T$6_p$ to a time point T$7_p$, the sixth voltage level V$6_p$ of the reference voltage trimming node REF may be lower than the voltage level VFB of the feedback node FB. Accordingly, the voltage detection signal VPPDET of the comparator 230 may be at a logic low level. The test host 12 may adjust again the command up code TMRS_UP_CODE[7:1] to increase the voltage level of the reference voltage trimming node REF. As an example, the test host 12 may set a command up code TMRS_UP_CODE[2] to 1 (S940). Here, the command up code TMRS_UP_CODE[7:1] may be 1001010. The voltage level of the reference voltage trimming node REF may then be increased from the sixth voltage level V$6_p$ to a seventh voltage level V$7_p$.

From the time point T$7_p$ to a time point T$8_p$, the seventh voltage level V$7_p$ of the reference voltage trimming node REF may be higher than the voltage level VFB of the feedback node FB. Accordingly, the voltage detection signal VPPDET of the comparator 230 may be at a logic high level. The test host 12 may adjust again the command down code TMRS_DN_CODE[7:1] to decrease the voltage level of the reference voltage trimming node REF. As an example, the test host 12 may set the command down code TMRS_DN_CODE[1] to 1 (S930). The voltage level of the reference voltage trimming node REF may then be decreased from the seventh voltage level V$7_p$ to the voltage level VFB of the feedback node FB.

From the time point T$1_p$ to the time point T$8_p$, the test host 12 may adjust the command up code TMRS_UP_CODE[7:1] and the command down code TMRS_DN_CODE[7:1]. After the time point T$8_p$, the command up code TMRS_UP_CODE[7:1], e.g., 1001010, and the command down code TMRS_DN_CODE[7:1], e.g., 0110101, may be selectively programmed in the anti-fuse array 25. The anti-fuses corresponding to a code of 1 of the command up code TMRS_UP_CODE[7:1] and the command down code TMRS_DN_CODE[7:1] may be ruptured, and the anti-fuses corresponding to a code of 0 of the command up code TMRS_UP_CODE[7:1] and the command down code TMRS_DN_CODE[7:1] may not be ruptured.

Figure 11:
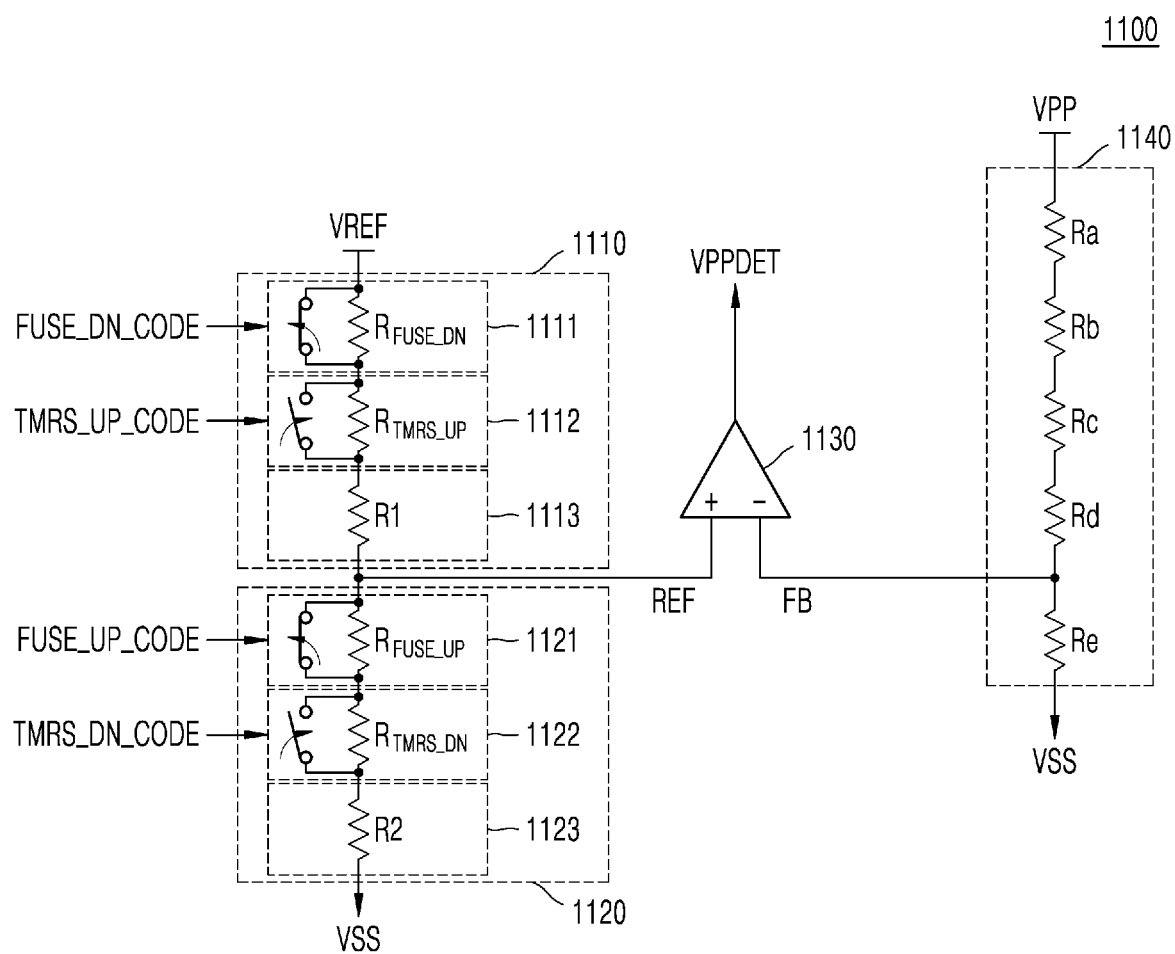
FIGS. 11, 12A and 12B are diagrams describing a comparison example of the voltage trimming circuit of FIG. 2.
Figure 12A:
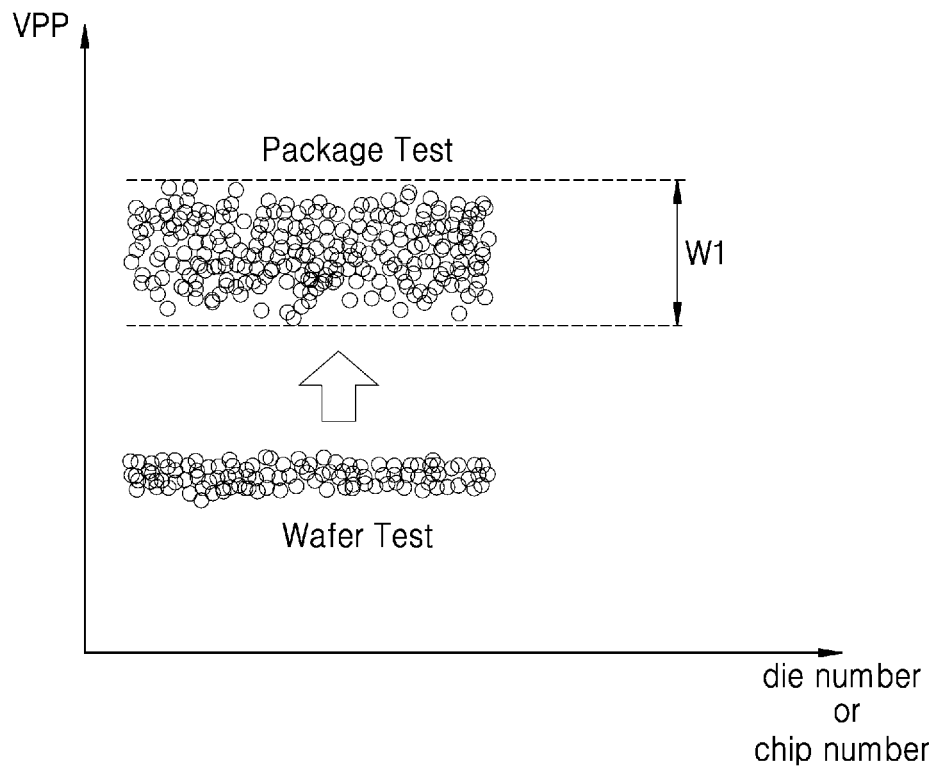
Figure 12B:
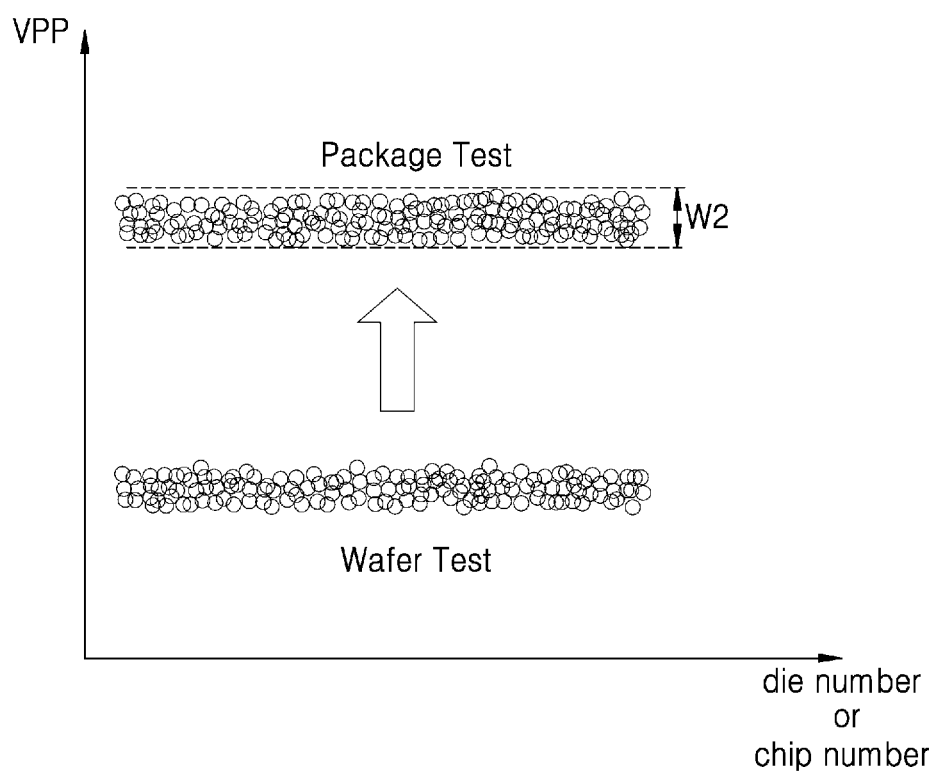

FIGS. 11, 12A and 12B are diagrams describing a comparison example of the voltage trimming circuit 23 of FIG. 2. FIG. 11 illustrates a circuit diagram of a voltage trimming circuit 1100, and FIGS. 12A and 12B illustrate voltage trimming distributions by the voltage trimming circuits 23 and 1100 of FIGS. 2 and 11, respectively.

Referring to FIG. 11, the voltage trimming circuit 1100 may be different from the voltage trimming circuit 23 of FIG. 2 in the configuration of a first resistor circuit unit 1110 and a second resistor circuit unit 1120. The first resistor circuit unit 1110 may include a fuse down resistance circuit 1111 having a fuse down resistance value $R_{FUSE\_DN}$ determined by the fuse down code FUSE_DN_CODE, a command up resistance circuit 1112 having a command up resistance value $R_{TMRS\_UP}$ determined by the command up code TMRS_UP_CODE, and a first resistor 1113 having the first resistance value R1. The second resistor circuit unit 1120 may include a fuse up resistance circuit 1121 having a fuse up resistance value $R_{FUSE\_UP}$ determined by the fuse up code FUSE_UP_CODE, a command down resistance circuit 1122 having a command down resistance value $R_{TMRS\_DN}$ determined by the command down code TMRS_DN_CODE, and a second resistor 1123 having a second resistance value R2.

In the voltage trimming circuit 1100, a total resistance value, that is obtained by Formula 3 and determined by the trimming by the command up code TMRS_UP_CODE before the trimming by the fuse down code FUSE_DN_CODE and the fuse up code FUSE_UP_CODE, may be different from a total resistance value, that is obtained by Formula 6 and determined by the trimming by the command up code TMRS_UP_CODE after the trimming by the fuse up code FUSE_UP_CODE.

$$V(REF) = VREF \times \left( \frac{(R2 + R_{TMRS-DN})}{(R1 + R2 + R_{TMRS-DN}) + R_{TMRS-UP}} \right) = \quad \text{[Formula 1]}$$

$$VREF \times \left( \frac{A}{B + R_{TMRS-UP}} \right)$$

$$V(REF_{TMRS-UP}) = \quad \text{[Formula 2]}$$

$$VREF \times \left( \frac{(R2 + R_{TMRS-DN})}{(R1 + R2 + R_{TMRS-DN})} \right) = VREF \times \left( \frac{A}{B} \right)$$

$$\Delta V(REF) = \quad \text{[Formula 3]}$$

$$V(REF_{TMRS-UP}) - V(REF) = VREF \times \left( \frac{A}{B} - \frac{A}{B + R_{TMRS-UP}} \right)$$

$$V(REF_{FUSE-UP}) = \quad \text{[Formula 4]}$$

$$VREF \times \left( \frac{(R2 + R_{TMRS-DN} + R_{FUSE-UP})}{(R1 + R2 + R_{TMRS-DN} + R_{FUSE-UP}) + R_{TMRS-UP}} \right) =$$

$$VREF \times \left( \frac{C}{D + R_{TMRS-UP}} \right)$$

$$V(REF_{FUSE-UP,TMRS-UP}) = \quad \text{[Formula 5]}$$

$$VREF \times \left( \frac{(R2 + R_{TMRS-DN} + R_{FUSE-UP})}{(R1 + R2 + R_{TMRS-DN} + R_{FUSE-UP})} \right) = VREF \times \left( \frac{C}{D} \right)$$

$$\Delta V(REF) = V(REF_{FUSE-UP,TMRS-UP}) - V(REF_{FUSE-UP}) = \quad \text{[Formula 6]}$$

$$VREF \times \left( \frac{C}{D} - \frac{C}{D + R_{TMRS-UP}} \right)$$

In this case, Formula 1 may provide the resistance value before the trimming by the fuse down code FUSE_DN_CODE and the fuse up code FUSE_UP_CODE, and Formula 2 may provide the resistance value after the trimming by the command up code TMRS_UP_CODE, before the trimming by the fuse down code FUSE_DN_CODE and the fuse up code FUSE_UP_CODE. Formula 4 may provide the resistance value after the trimming by the fuse up code FUSE_UP_CODE, and Formula 5 may provide the resistance value after the trimming by the command up code TMRS_UP_CODE after the trimming by the fuse up code FUSE_UP_CODE. According to Formula 5, the resistance value RTMRS_UP may be shorted by the command up code TMRS_UP_CODE.

In the voltage trimming circuit 1100 of FIG. 11, the resistance values before and after the trimming by the fuse down code FUSE_DN_CODE and/or the fuse up code FUSE_UP_CODE performed during the wafer level test may be different from each other. Due to this reason, as illustrated in FIG. 12A, a voltage trimming distribution W1 in the package test performed after the wafer test may be wide.

To the contrary, in the voltage trimming circuit 23, a total resistance value, that is obtained by Formula 9 and determined by the trimming by the command up code TMRS_UP_CODE before the trimming by the fuse down code FUSE_DN_CODE and the fuse up code FUSE_UP_CODE, may be same as a total resistance value, that is obtained by Formula 12 and determined by the trimming by the command up code TMRS_UP_CODE after the trimming by the fuse up code FUSE_UP_CODE.

$$V(REF) = VREF \times \quad \text{[Formula 7]}$$

$$\left( \frac{(R2 + R_{FUSE-DN} + R_{TMRS-DN})}{(R1 + R2 + R1_{FUSE-UP} + R1_{TMRS-UP} + R2_{FUSE-DN} + R2_{TMRS-DN})} \right) =$$

$$VREF \times \left( \frac{A}{B} \right)$$

$$V(REF_{TMRS-UP}) = VREF \times \quad \text{[Formula 8]}$$

$$\left( \frac{(R2 + R2_{FUSE-DN} + R2_{TMRS-DN} + R2_{TMRS-UP})}{(R1 + R2 + R1_{FUSE-UP} + R2_{FUSE-DN} + R2_{TMRS-DN} + R2_{TMRS-UP})} \right) =$$

$$VREF \times \left( \frac{A + R2_{TMRS-UP}}{B} \right)$$

$$\Delta V(REF) = V(REF_{TMRS-UP}) - V(REF) = \quad \text{[Formula 9]}$$

$$VREF \times \left( \frac{A + R2_{TMRS-UP}}{B} - \frac{A}{B} \right) = VREF \times \left( \frac{R2_{TMRS-UP}}{B} \right)$$

$$V(REF_{TMRS-UP}) = VREF \times \quad \text{[Formula 10]}$$

$$\left( \frac{(R2 + R2_{FUSE-DN} + R2_{TMRS-DN} + R2_{TMRS-UP})}{(R1 + R2 + R1_{FUSE-UP} + R2_{FUSE-DN} + R2_{TMRS-DN} + R2_{FUSE-UP})} \right) =$$

$$VREF \times \left( \frac{C}{B} \right)$$

$$V(REF_{FUSE-UP,TMRS-UP}) = VREF \times \quad \text{[Formula 11]}$$

$$\left( \frac{(R2 + R2_{FUSE-DN} + R2_{TMRS-DN} + R2_{FUSE-UP}) + R2_{TMRS-UP}}{(R1 + R2 + R2_{FUSE-DN} + R2_{TMRS-DN} + R2_{FUSE-UP} + R2_{TMRS-UP})} \right) =$$

$$VREF \times \left( \frac{C + R2_{TMRS-UP}}{B} \right)$$

$$\Delta V(REF) = V(REF_{FUSE-UP,TMRS-UP}) - V(REF_{FUSE-UP}) = \quad \text{[Formula 12]}$$

$$VREF \times \left( \frac{C + R2_{TMRS-UP}}{B} - \frac{C}{B} \right) = VREF \times \left( \frac{R2_{TMRS-UP}}{B} \right)$$

In this case, Formula 7 may provide the resistance value before the trimming by the fuse down code FUSE_DN_CODE and the fuse up code FUSE_UP_CODE, and Formula 8 may provide the resistance value after the trimming by the command up code TMRS_UP_CODE, before the trimming by the fuse down code FUSE_DN_CODE and the fuse up code FUSE_UP_CODE. According to Formula 8, the resistance valve R1TMRS_UP of the first command up resistance circuit 310 of the first resistance circuit unit 210 may be shorted by the command up code TMRS_UP_CODE. Formula 10 may provide the resistance value after the trimming by the fuse up code FUSE_UP_CODE, and Formula 11 may provide the resistance value after the trimming by the command up code TMRS_UP_CODE after the trimming by the fuse up code FUSE_UP_CODE. According to Formula 10, the resistance value R1FUSE_UP of the first fuse up resistance circuit 330 may be shorted by the fuse up code FUSE_UP_CODE, and according to Formula 11, the resistance value R1FUSE_UP of the first fuse up resistance circuit 330 may be shorted by the fuse up code FUSE_UP_CODE, and the resistance value R1TMRS_UP of the first command up resistance circuit 310 may be shorted by the command up code TMRS_UP_CODE.

In the voltage trimming circuit 23 of FIG. 2, the resistance values before and after the trimming by the fuse down code FUSE_DN_CODE and/or the fuse up code FUSE_UP_CODE performed during the wafer level test may be the same as each other. Thus, as illustrated in FIG. 12B, a voltage trimming distribution W2 in the package test performed after the wafer test may be narrow.

While the inventive concept has been particularly shown and described with reference to embodiments thereof, it will be understood that various changes in form and details may be made thereto without departing from the spirit and scope of the inventive concept as set forth in the following claims.

What is claimed is:

1. A voltage trimming circuit configured to trim a reference voltage to a first voltage, the voltage trimming circuit comprising:
    a first resistance circuit connected between a reference voltage line and a reference voltage trimming node, the first resistance circuit having a first resistance value determined by first and second up codes and first and second down codes, the first up and down codes being adjusted with respect to a first voltage level during a first voltage trimming operation, the second up and down codes being adjusted with respect to a first voltage range having a positive or negative range with respect to the first voltage level during a second voltage trimming operation;
    a second resistance circuit connected between the reference voltage trimming node and a ground voltage line, the second resistance circuit having a second resistance value determined by the first and second up codes and the first and second down codes; and
    a comparator configured to output a voltage detection signal by comparing a voltage level of the reference voltage trimming node with a voltage level of a feedback node connected to the first voltage.

2. The voltage trimming circuit of claim 1, wherein the voltage detection signal adjusts the first and second up codes and the first and second down codes, which increase the first resistance value and decrease the second resistance value when the voltage level of the reference voltage trimming node is higher than the voltage level of the feedback node, and adjusts the first and second up codes and the first and second down codes, which decrease the first resistance value and increase the second resistance value when the voltage level of the reference voltage trimming node is lower than the voltage level of the feedback node.

3. The voltage trimming circuit of claim 1, wherein the first voltage is higher than a power voltage, and
    the voltage trimming circuit comprises a plurality of resistors connected to each other in series between a high voltage line and the ground voltage line, and further comprises a voltage generator for setting a connection node between the plurality of resistors as the feedback node.

4. The voltage trimming circuit of claim 1, wherein the first resistance circuit comprises:
    a first command up resistance circuit configured to increase the voltage level of the reference voltage trimming node by decreasing the first resistance value in response to the second up code;
    a first command down resistance circuit configured to decrease the voltage level of the reference voltage trimming node by increasing the first resistance value in response to the second down code;
    a first fuse up resistance circuit configured to increase the voltage level of the reference voltage trimming node by decreasing the first resistance value in response to the first up code; and
    a first fuse down resistance circuit configured to decrease the voltage level of the reference voltage trimming node by increasing the first resistance value in response to the first down code.

5. The voltage trimming circuit of claim 4, wherein the second resistance circuit comprises:
    a second command up resistance circuit configured to increase the voltage level of the reference voltage trimming node by increasing the second resistance value in response to the second up code;
    a second command down resistance circuit configured to decrease the voltage level of the reference voltage trimming node by decreasing the second resistance value in response to the second down code;
    a second fuse up resistance circuit configured to increase the voltage level of the reference voltage trimming node by increasing the second resistance value in response to the first up code; and
    a second fuse down resistance circuit configured to decrease the voltage level of the reference voltage trimming node by decreasing the second resistance value in response to the first down code.

6. The voltage trimming circuit of claim 5, wherein the first resistance circuit and the second resistance circuit are symmetrical to each other with respect to the reference voltage trimming node.

7. The voltage trimming circuit of claim 5, wherein each bit of the first and second up codes causes a different magnitude increase in the voltage level of the reference voltage trimming node.

8. The voltage trimming circuit of claim 7, wherein the first and second up codes are sequentially adjusted from a largest magnitude increase to a smallest magnitude increase in the voltage level of the reference voltage trimming node.

9. The voltage trimming circuit of claim 5, wherein each bit of the first and second down codes causes a different magnitude decrease in the voltage level of the reference voltage trimming node.

10. The voltage trimming circuit of claim 9, wherein the first and second down codes are sequentially adjusted from a largest magnitude decrease to a smallest magnitude decrease in the voltage level of the reference voltage trimming node.

11. The voltage trimming circuit of claim 1, wherein the voltage trimming circuit is included in a memory device, and the first voltage trimming operation is performed during a wafer test of the memory device.

12. The voltage trimming circuit of claim 11, wherein the second voltage trimming operation is performed during a package test of the memory device.

13. A method of operating a voltage trimming circuit for trimming a reference voltage to a first voltage, the method comprising:
    receiving first up and down codes, the first up and down codes being adjusted with respect to a first voltage level during a first voltage trimming operation;
    receiving second up and down codes, the second up and down codes being adjusted with respect to a first voltage range having a positive or negative range with respect to the first voltage level during a second voltage trimming operation;

providing the first and second up codes and the first and second down codes to a first resistance circuit connected between a reference voltage line and a reference voltage trimming node, the first resistance circuit having a first resistance value determined by the first and second up codes and the first and second down codes;

providing the first and second up codes and the first and second down codes to a second resistance circuit connected between the reference voltage trimming node and a ground voltage line, the second resistance circuit having a second resistance value determined by the first and second up codes and the first and second down codes; and outputting a voltage detection signal by comparing a voltage level of the reference voltage trimming node with a voltage level of a feedback node connected to the first voltage.

14. The method of claim 13, further comprising adjusting the first and second up codes and the first and second down codes based on the voltage detection signal.

15. The method of claim 14, wherein when the voltage level of the reference voltage trimming node is higher than the voltage level of the feedback node, the first and second up codes and the first and second down codes are adjusted so that the first resistance value is increased and the second resistance value is decreased to lower the voltage level of the reference voltage trimming node based on the voltage detection signal.

16. The method of claim 15, wherein each bit of the first and second down codes generates a different magnitude decrease in the voltage level of the reference voltage trimming node.

17. The method of claim 16, wherein the first and second down codes are sequentially adjusted from a largest magnitude decrease to a smallest magnitude decrease in the voltage level of the reference voltage trimming node.

18. The method of claim 14, wherein when the voltage level of the reference voltage trimming node is lower than the voltage level of the feedback node, the first and second up codes are adjusted so that the first resistance value is decreased and the second resistance value is increased to higher the voltage level of the reference voltage trimming node based on the voltage detection signal.

19. The method of claim 18, wherein each bit of the first and second up codes generates a different magnitude increase in the voltage level of the reference voltage trimming node.

20. The method of claim 19, wherein the first and second up codes are sequentially adjusted from a largest magnitude decrease to a smallest magnitude increase in the voltage level of the reference voltage trimming node.

* * * * *